United States Patent [19]

Yagi et al.

[11] Patent Number: 4,731,923

[45] Date of Patent: Mar. 22, 1988

[54] APPARATUS AND METHOD FOR MOUNTING CIRCUIT ELEMENT ON PRINTED CIRCUIT BOARD

[75] Inventors: Hiroshi Yagi; Shuichi Tando; Yoshihito Oba; Toshihisa Nakamura, all of Tokyo, Japan

[73] Assignee: TDK Corporation, Tokyo, Japan

[21] Appl. No.: 23,117

[22] Filed: Mar. 6, 1987

[30] Foreign Application Priority Data

| Mar. 15, 1986 | [JP] | Japan | 61-56062 |
| Mar. 29, 1986 | [JP] | Japan | 61-69763 |
| Apr. 17, 1986 | [JP] | Japan | 61-56868[U] |
| May 2, 1986 | [JP] | Japan | 61-66183[U] |
| May 27, 1986 | [JP] | Japan | 61-79664[U] |
| May 27, 1986 | [JP] | Japan | 61-79665[U] |
| May 29, 1986 | [JP] | Japan | 61-80320 |
| Dec. 25, 1986 | [JP] | Japan | 61-310957 |
| Dec. 25, 1986 | [JP] | Japan | 61-310958 |

[51] Int. Cl.$^4$ .................. H05K 3/30; B23P 19/00
[52] U.S. Cl. ........................... 29/833; 29/241; 29/834; 228/6.2
[58] Field of Search .......... 29/840, 836, 741, 834, 29/833; 228/6.2

[56] References Cited

U.S. PATENT DOCUMENTS

| 3,774,834 | 11/1973 | Holler et al. | 228/6.2 X |
| 3,909,933 | 10/1975 | Doubek, Jr. et al. | 29/836 |
| 3,946,931 | 3/1976 | Bahnck et al. | 29/834 X |
| 3,982,979 | 9/1976 | Hentz et al. | 29/834 X |
| 4,135,630 | 1/1979 | Snyder et al. | |
| 4,166,562 | 9/1979 | Keizer et al. | 29/741 X |
| 4,236,301 | 12/1980 | Hug et al. | 29/741 X |
| 4,327,482 | 5/1982 | Araki et al. | |
| 4,437,232 | 3/1984 | Araki et al. | 228/6.2 |
| 4,606,117 | 8/1986 | Takahashi et al. | 29/834 X |
| 4,659,004 | 4/1987 | Fridman | 228/6.2 |
| 4,670,981 | 6/1987 | Kubota et al. | 29/840 |

FOREIGN PATENT DOCUMENTS 80512 6/1983 European Pat. Off. .............. 29/741

OTHER PUBLICATIONS

Western Electric Tech Digest No. 21, Jan. 1971, pp. 29-31 by O. H. Olson et al.

Primary Examiner—Howard N. Goldberg
Assistant Examiner—Carl J. Arbes
Attorney, Agent, or Firm—Frishauf, Holtz, Goodman & Woodward

[57] ABSTRACT

An automatic circuit element mounting apparatus includes a lead wire detection mechanism for detecting lead wires of a circuit element held on a mounting head by suction and a substrate mark detection mechanism for detecting a mounting reference mark of a printed circuit board on which the circuit element is mounted by means of the mounting head, so that the amount of movement of the mounting head may be corrected depending on a result of detection by each of the detection mechanisms to precisely mount the circuit element on the printed circuit board. Also, a method for mounting a circuit element on a printed circuit board is disclosed.

20 Claims, 50 Drawing Figures

FIG. 6
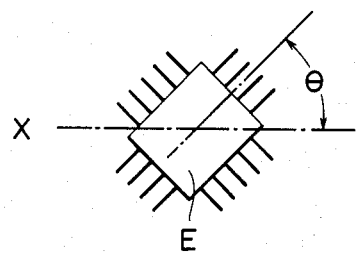
FIG. 7   FIG. 8   FIG. 9
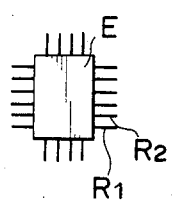 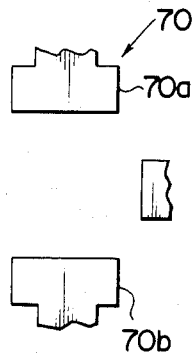 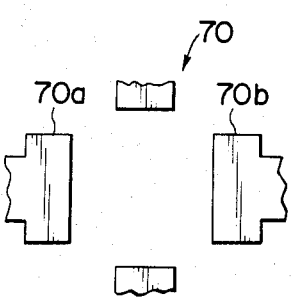

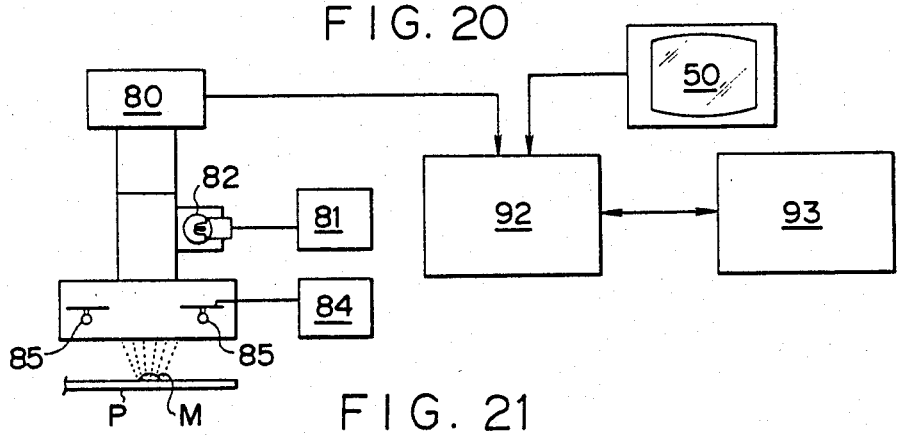
FIG. 20
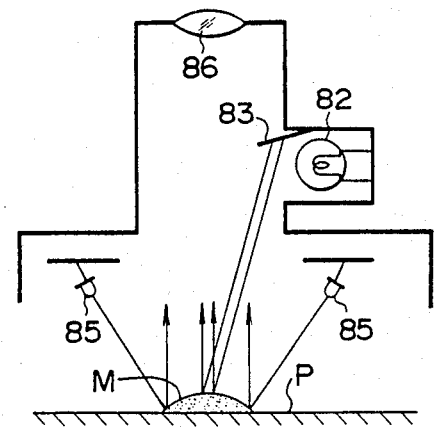
FIG. 21
FIG. 22
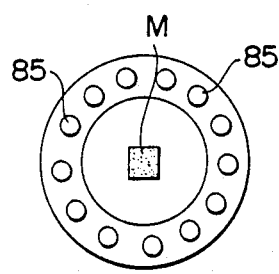
FIG. 23
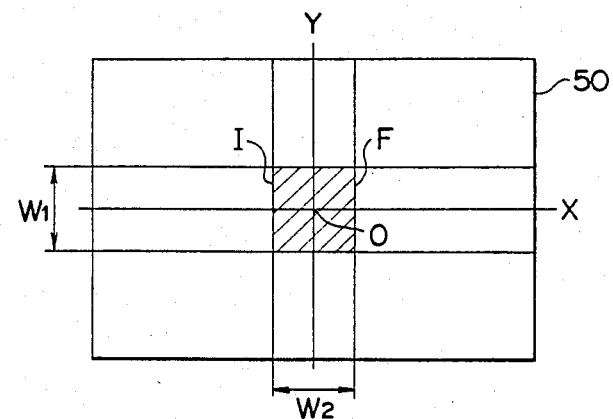

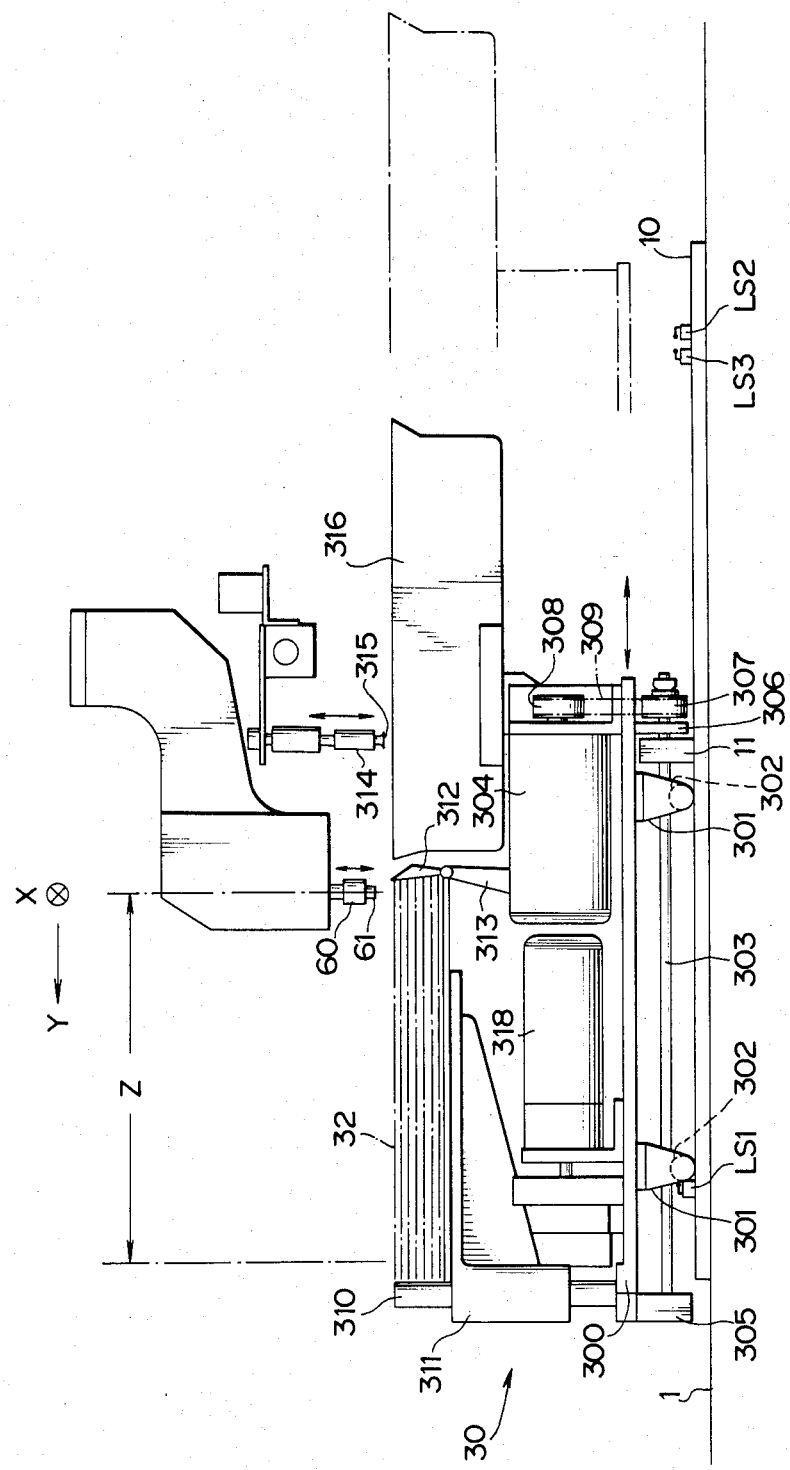

APPARATUS AND METHOD FOR MOUNTING CIRCUIT ELEMENT ON PRINTED CIRCUIT BOARD

BACKGROUND OF THE INVENTION

1. Field of the Invention

This invention relates to an apparatus and method for mounting a circuit element on a substrate, and more particularly to an apparatus and method for a surface mounting-type electronic circuit element such as a Flat Plastic Package component (hereinafter referred to as "FPP"), a Plastic Leaded Chip Carrier component (hereinafter referred to as "PLCC"), a Leadless Chip Carrier component (hereafter referred to as "LCC"), a Small Outline Integrated Circuit component (hereinafter referred to as "SOIC") or the like on a substrate or a printed circuit board with high accuracy.

2. Description of the Prior Art

Such a conventional circuit element mounting apparatus is adapted to carry out positioning of a printed circuit board with respect to the apparatus by means of a positioning hole formed on a surface of the board. Also, positioning of a mounting head is carried out on the basis of origins of X and Y coordinates of an X-Y table head on which the mounting head is mounted. In the conventional mounting apparatus, a positional relationship between the positioning hole of the printed circuit board and a conducting pattern (wiring pattern) on the printed circuit board is deemed to be not varied depending on a printed circuit board and likewise a relative positional relationship between the positioning hole and the origins of the X and Y coordinates of the X-Y table head is deemed to be constant irrespective of a printed circuit board.

The positioning hole of the printed circuit board is formed by drilling subsequently to formation of the conducting pattern, resulting in a positional error in the formation of the hole being as large as about 0.3 mm. This causes misregistration as large as 0.3 mm to occur between the amount of movement of the mounting head to a circuit element mounting position on the printed circuit board and the actual circuit element mounting position. Unfortunately, the relative positional relationship between the positioning hole and the origin as of the X-Y table which is merely kept constant in the conventional apparatus fails to prevent the misregistration. The misregistration of about 0.3 mm often causes a failure in connecting of a surface mounting-type circuit element called an FPP, a PLCC, an LCC or an SOIC with respect to a substrate, because it is so constructed that an interval between lead wires of the circuit element is small.

Also, the deviation of the positioning hole on the printed circuit board causes mounting of a circuit element on the printed circuit board to be carried out at a wrong posture.

SUMMARY OF THE INVENTION

The present invention has been made in view of the foregoing disadvantages of the prior art.

Accordingly, it is an object of the present invention to provide an apparatus and method for mounting a circuit element on a substrate which is capable of mounting a circuit element on a substrate with high accuracy.

It is another object of the present invention to provide such an apparatus which is capable of facilitating supply of a circuit element, particularly, a surface-mounting type circuit element such as an FPP, a PLCC, an LCC, an SOIC or the like to a predetermined circuit element extracting position.

It is a further object of the present invention to provide such an apparatus which is capable of discretely supplying circuit elements one by one with a simple structure.

It is still another object of the present invention to provide such an apparatus which is capable of allowing even a chip-like circuit element to be intermittently carried to a predetermined circuit element extracting position without any trouble while being kept at a correct posture.

It is yet another object of the present invention to provide such an apparatus which is capable of carrying out disposal of an empty storage tape from which circuit elements have been removed while ensuring smooth operation of other mechanisms such as a tape supply mechanism and the like.

It is still a further object of the present invention to provide such a method which is capable of facilitating centering of a circuit element particularly, a surface-mounting type circuit element without deforming or bending its lead wires.

In accordance with one aspect of the present invention, an apparatus for mounting a circuit element on a substrate includes a circuit element supply mechanism for supplying a circuit element to a predetermined position of the apparatus, a centering and optional turning mechanism for regulating a position and a posture of the circuit element and a circuit element extracting head arranged so as to be movable between the predetermined position and arranging position of the centering and optional turning mechanism. The extracting head is adapted to extract the circuit element from the supply mechanism by suction and deliver it to the centering and optional turning mechanism. Also, the apparatus includes a mounting head arranged so as to be movable with respect to a printed circuit board. The mounting head is adapted to hold thereon the circuit element of which the position and posture have been regulated by the centering and optional turning mechanism by suction and carry it to the printed circuit board. Further, the apparatus includes a substrate support mechanism for supporting thereon the printed circuit board on which the circuit element is to be mounted, a lead wire detection mechanism for detecting lead wires of the circuit element of which the position and posture have been regulated by the centering and optional turning mechanism, and a substrate mark detection mechanism for detecting a mounting reference mark on the printed circuit board supported on the substrate support mechanism. Thus, the apparatus allows movement of the mounting head with respect to the printed circuit board to be corrected depending on a result of detection by each of the detection mechanisms.

According to a further aspect of the present invention, there is provided a method for mounting a circuit element on a printed circuit board, comprising the steps of supplying a circuit element to a predetermined position of an automatic mounting apparatus; transferring the circuit element from the predetermined position to a centering and optional turning mechanism incorporated in the mounting apparatus to carry out the centering and turning of the circuit element by four claws, the four claws being mounted on the centering and optional turning mechanism and being arranged so as to be opposite to four sides of a circuit element; delivering the circuit element to a mounting head; conveying a printed circuit board to a stop position; and mounting the circuit element on the printed circuit board when is at the stop position; the step of centering and optional turning of the circuit element by the four claws comprising holding two sides of the circuit element parallel to each other between one pair of claws of the four claws positioned oppsoitely to the two parallel sides of the circuit element through a tip end of each of lead wires projecting from the two parallel sides or a body of the circuit element and then separating the two claws from the lead wires or the body, and thereafter holding the remaining two sides of the circuit element between the other pair of claws through a tip end of each of lead wires projecting from the remaining two sides or the body.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIG. 6 is a schematic plan view showing a posture of a circuit element;

FIGS. 7 to 9 each are a schematic view showing preliminary turning of a circuit element by a centering and optional turing mechanism;

FIG. 20 is a schematic view showing an optical processing system to which correction of misregistration is applied;

FIG. 21. is a schematic view showing irradiation in the optical processing system of FIG. 20;

FIG. 22 is a schematic view showing an irradiation mechanism which is adapted to carry out irradiation of FIG. 22;

FIG. 23 is a schematic view showing a reference pattern of a TV projector used in image processing;

FIG. 31 is a front elevation view showing a tray carrying mechanism or unit for supplying circuit elements;

DETAILED DESCRIPTION OF THE PREFERRED EMBODIMENT

An automatic circuit element mounting apparatus according to the present invention will be described hereinafter with reference to the accompanying drawings.

Figure 1:
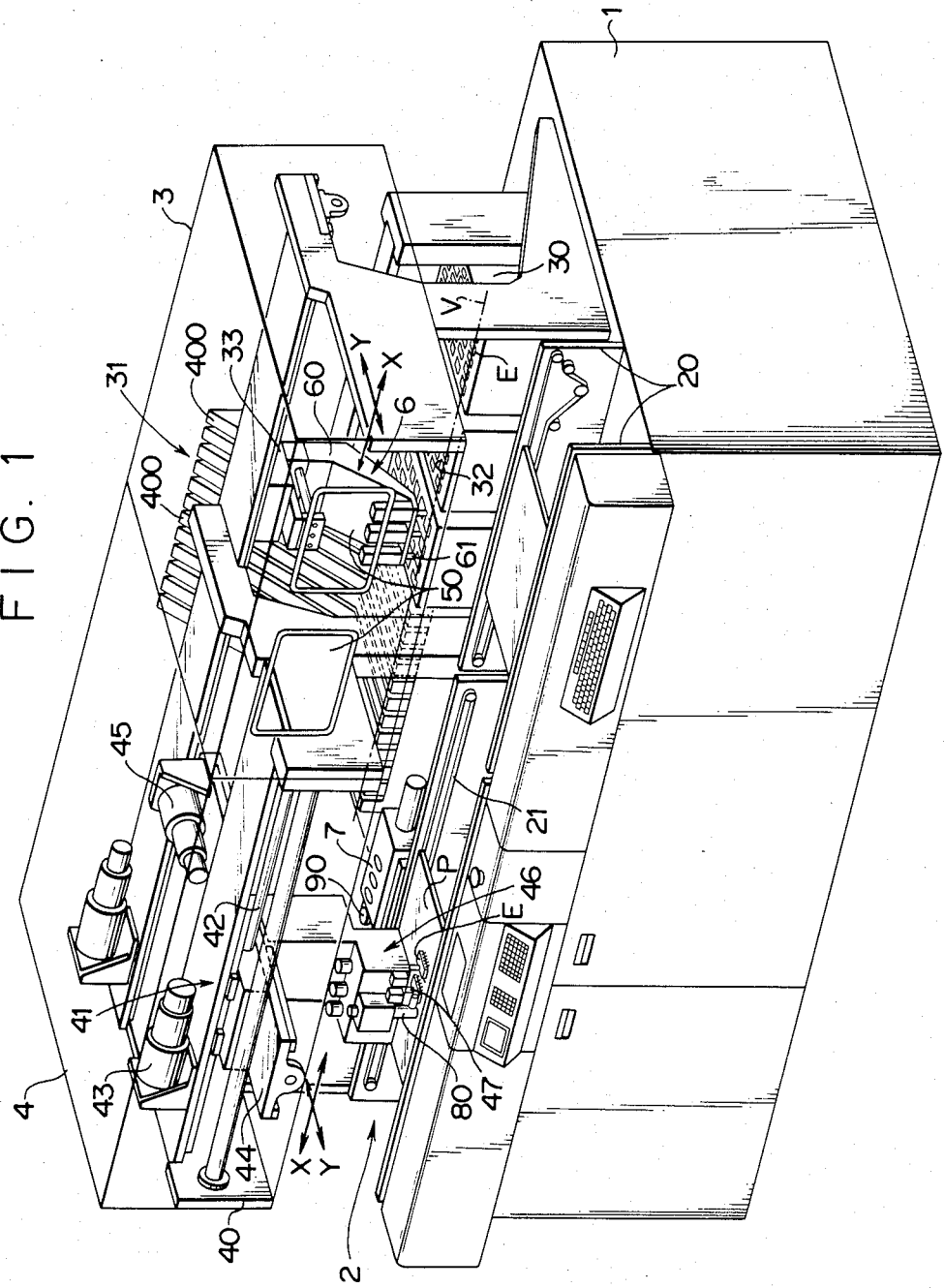
FIG. 1 is a perspective view generally showing an embodiment of an automatic circuit element mounting apparatus according to the present invention.

FIG. 1 shows a general structure of an embodiment of an automatic circuit element mounting apparatus according to the present invention. An apparatus of the illustrated embodiment includes a base 1, a substrate carrying mechanism or unit 2 arranged on a front side of the base 1 so as to carry printed circuit boards in turn, a circuit element supply mechanism or unit 3 arranged on a right side of a rear portion of the base 1 in FIG. 1, and a circuit element mounting mechanism or unit 4 on a left side of the base 1. Also, the apparatus includes televisions 50 incorporated in a picture processing mechanism or unit and positioned above the front portion of the base 1. In FIG. 1, only telescreens are shown for the televisions 50.

The substrate carrying mechanism 2 includes a pair of support frames 20 mounted on the base 1 and a belt conveyor 21 provided on each of inner surfaces of the support frames 20 opposite to each other. The substrate carrying mechanism 2 is adapted to insert a positioning pin (not shown) into a positioning hole H of a printed circuit board P (FIG. 2) at a substrate stopping position or substrate locating position to securely hold the board P.

The circuit element supply mechanism 3 comprises both a tray feeder 30 for supplying surface-mounting type circuit elements E such as an FPP, a PLCC, and LCC, an SOIC and the like and a stick feeder 31 or a tape feeder (in FIG. 1, a stick feeder 31 is shown).

The tray feeder 30 is adapted to arrange a plurality of trays 32 is a stacked manner each having circuit elements E arranged in rows thereon. The tray feeder 30 is forward moved one pitch every time when foremost circuit elements on an uppermost tray are taken out or extracted therefrom at a circuit element extracting position V, so that a subsequent row of circuit elements on the tray may be transferred to the extracting position.

The stick feeder 31 is constructed to store circuit elements in a stacked manner in a rectangular cylinder-like stick and carry lowermost one of the circuit elements to the circuit element extracting position V by means of a belt feeder.

The tape feeder includes a tape having circuit elemenets held thereon in a row in the longitudinal direction of the tape and being wound on a reel, and is adapted to feed the circuit elements carried on the tape to the circuit element extracting position V in turn.

The apparatus of the illustrated embodiment also includes a circuit element extracting mechanism 6 mounted on an X-Y table 33 movably arranged on the base 1. The extracting mechanism 6 includes an extracting head 60 which is adapted to extract a circuit element from the tray feeder 30 by suction, stick feeder 31 or tape feeder at the circuit element extracting position V by means of a suction pin 61 and deliver it to a centering and optional turning mechanism 7.

The circuit element mounting mechanism 4 is mounted or assembled on a support frame 40 arranged above the substrate carrying mechanism 2 in a manner to hang over it. The support frame 40 is also attached thereto an X-Y table head 41. More particularly, the X-Y table head 41 includes an X directin slider 44 supported on an X direction sliding shaft 42 fixed on the frame 40 so as to be slidable in an X direction and engaged with an X direction ball thread shaft so as to be actuated by an X axis motor 43 and a Y direction slider supported on a Y direction sliding shaft arranged on the X direction slider side so as to be slidable in a Y direction and engaged with a Y direction ball thread shaft so as to be actuated by a Y axis motor 45.

The circuit element mounting mechanism 4 also includes a mounting head 46 fixedly mounted on a lower end of the Y direction slider. In the illustrated embodiment, the mounting head 46 has three suction pins 47 arranged at equal intervals in the x direction. Each of the suction pins 47 is adapted to be vertically moved following curved configuration of a cam.

Figure 2:
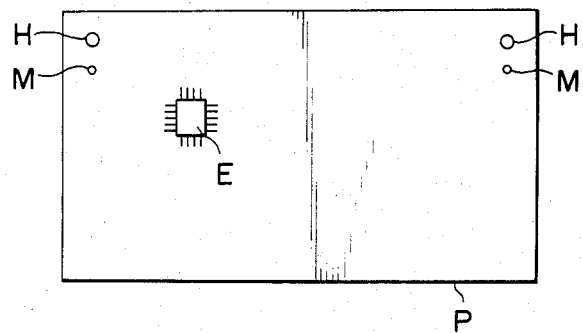
FIG. 2 is a plan view showing positioning holes and mounting reference marks provided on a printed circuit board.

On the mounting head 46 is securely mounted a camera 80 of a sustrate mark detection mechanism for detecting or inspecting a mounting reference mark M formed on the printed circuit board P simultaneously with formation of a conducting pattern thereon as shown in FIG. 2. In the illustrated embodiment, two such mounting reference marks M are provided to permit a deviation or variation in parallelism of the printed circuit P with respect to the substate carrying mechanism 2 to be effectively detected. Also, the mounting reference marks M may be formed together with the conducting pattern by etching, to thereby keep positional relationship between the conducting pattern and the mounting reference marks in each of the printed circuit boards constant.

Figure 3:
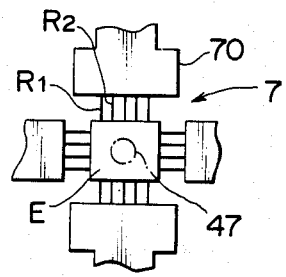
FIG. 3 is a schematic plan veiw showing four claws of a centering and optional turning mechanism incorporated in the mounting apparatus of FIG. 1.

The centering and optional turning mechanism 7 briefly described above is arranged along the substrate carrying mechanism 2 on the base 1. The centering and optional turning mechanism 7, as shown in FIG. 3, includes four-in-a-set position regulating claws 70 so as to correspond to a circuit element E held on the suction pin 61 of the circuit element extracting head 60 and each of the suction pins 47 of the mounting head 46 and is adapted to actuate the four claws 70 so as to narrow intervals between the claws, to thereby regulate lead wires R1, R2, . . . of the circuit element E, resulting in a center of the circuit element being aligned with that of the suction pin 47. At this time, a rotation angle $\theta$ (FIG. 6) indicating a posture of the circuit element is set at 0 degree. Then, when it is required to turn the circuit element E by an angle of 90°, 180°, 270° or any other desired degrees, each of the claws 70 is turned correspondingly. The centering and optional turning mechanism 7 may be constructed to carry out turning of the circuit element by only angles of 0°, 90°, 180° and 270°. Alternatively, it may carry out turning of the element by any optional angle.

Figure 4:
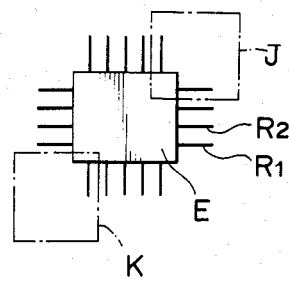
FIG. 4 is a schematic plan view showing lead wires of a circuit element displayed by a lead wire detecting camera.

The centering and optional turning mechanism 7 has a camera 90 for a lead wire detection mechanism fixedly mounted on a side thereof which serves to detect the lead wires R1, R2 . . . of the circuit element E after centering. The camera 90, as shown in FIG. 4, is adapted to project diagonal corners J and K of the circuit element E, in an enlarged manner, while switching them, so that position and rotation of each of the lead wires R1, R2 . . . of the circuit element E may be detected with high accuracy.

In order to opeate the automatic circuit element mounting apparatus of the illustrated embodiment, data on a position on the printed circuit board P on which the circuit element E is to be mounted and a posture at which the circuit element is to be mounted on the board P are inputted to a program controller. For example, the data on the mounting position may be indicated by X and Y coordinates of the X-Y table head and that on the mounting posture may be indicated by the rotation angle $\theta$. The program controller generates values of X and Y coordinates of a mounting position of the circuit element and a rotation angle of the circuit element, and the like in a mounting order and supplies them to the circuit element mounting mechanism 4 in turn.

Figure 5:
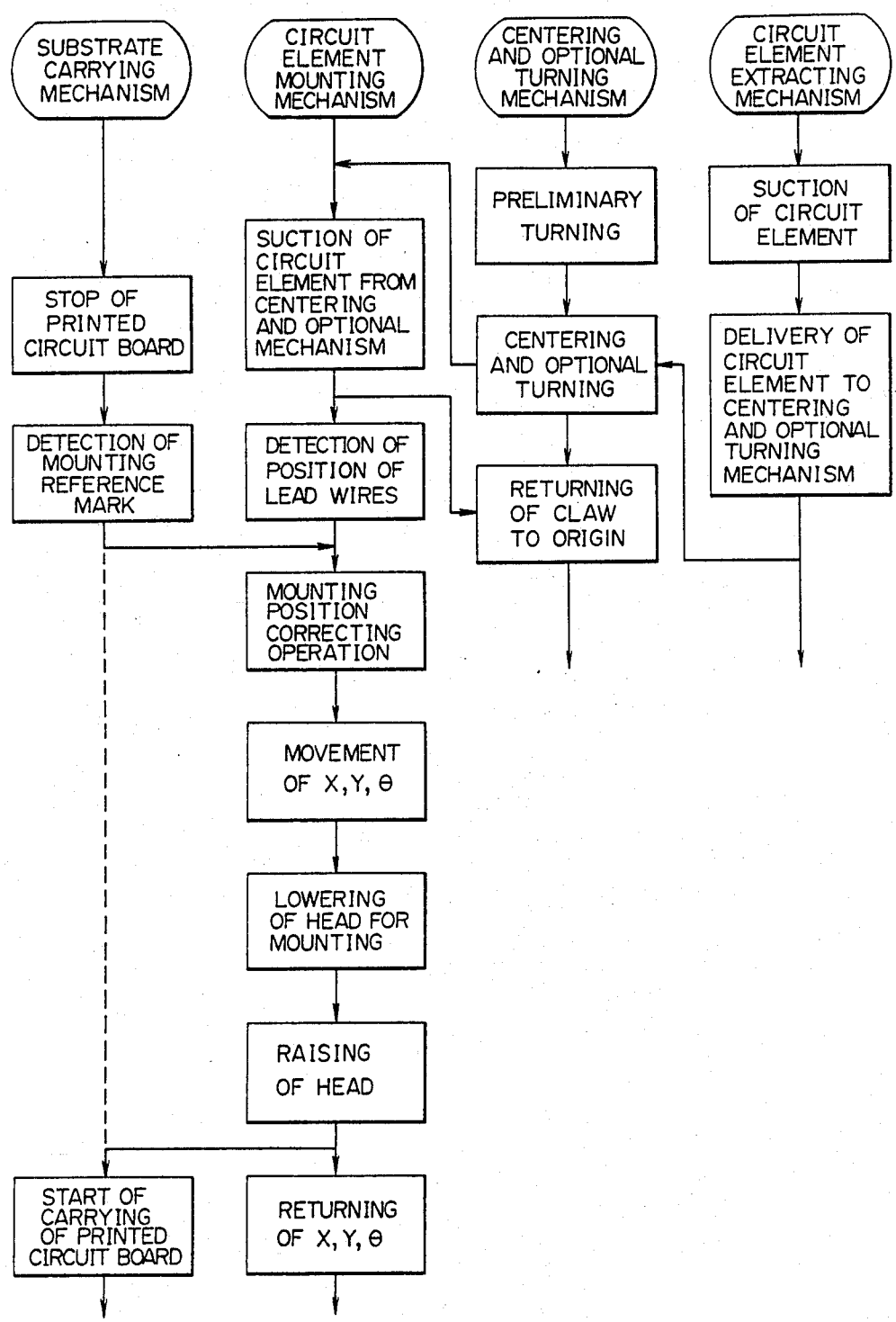
FIG. 5 is a flow chart showing operation of the automatic circuit element mounting apparatus shown in FIG. 1.

The circuit element mounting mechanism 4, substrate carrying mechanism 2, centering and optional turning mechanism 7, and circuit element extracting mechanism 6 carrying out their operations according to a flow chart shown in FIG. 5.

More particularly, the circuit element extracting head 60 of the circuit element extracting mechanism 6 takes out a circuit element E at the circuit element extracting position in the circuit element supply mechanism 3, then delivers it to the centering and optional turning mechanism 7 and finally returns to its original position for the next extraction.

The centering and optional turning mechanism 7 to which the circuit element E has been carried then carries out centering or positional regulation of the circuit element E by means of the four claws 70 shown in FIG. 3. Prior to the delivery of the circuit element E to the mechanism 7, preliminary turning of the mechanism 7 may be carried out to cause wider claws 70a and 70b to be engaged with wider sides of the circuit element E, as required. More particularly, supposing that the circuit element E in the circuit element supply mechanism 3 is at a posture shown in FIG. 7 and the position of origin of the centering and optional turning mechanism 7 causes the claws 70 to be arranged as shown in FIG. 8, the centering and optional turning mechanism 7 is prepared to receive the circuit element E from the circuit element extracting head 60 while the claws 70 are kept at a posture as shown in FIG. 9. Also, it carries out turning by a predetermined angle of $\theta$, as required.

Then, the mounting head 46 of the circuit element mounting mechanism 4 takes out the circuit element E indicated by the program controller from the centering and optional turning mechanism 7 by means of the suction pin 47 and holds it thereon by means of suction.

The lead wires of the circuit element E which has been subjected to the centering and turning treatment are observed by the camera 90 of the lead wire detection mechanism and a picture obtained is supplied to a position correcting operation unit or picture processing unit.

A printed circuit board P carried by the substrate carrying mechanism 2 is stopped at a predetermined position. Mounting reference marks M of the so-positioned printed circuit board P are observed through the camera 80 of the substrate mark detection mechanism and a picture obtained is supplied to the position correcting operation unit. The pictures obtained by the camera 80 and 90 are displayed on telescreens of the picture processing televisions 50.

The position correcting operation unit or picture processing unit or mechanism which receives a result of detection by each of the lead wire detection camera 90 and substrate mark detection camera 80 previously stores therein data on pictures of the cameras 80 and 90 showing a state that the circuit element is precisely positioned on a circuit element mounting position of the printed circuit board, so that it may carry out comparison between the stored picture data and an actual picture obtained by each of the cameras 80 and 90 to effect a mounting position correcting operation. This results in positional control of the mounting head 46 being carried out to obtain corrected X and Y coordinates and rotation angle $\theta$.

Subsequently, the suction pin 47 is lowered to mount the circuit element E on the predetermined circuit element mounting position of the printed circuit board P.

Thereafter, the suction pin is raised and the mounting head 46 returns to its original position for the next mounting operation.

As can be seen from the foregoing, the automatic circuit element mounting apparatus of the illustrated is so constructed that one of the cameras detects the mounting reference marks formed on the printed circuit board simultaneously with formation of the conducting pattern thereon and the other camera detects the lead wires of the circuit element subjected to the centering and optional turning treatment, thus, the amount of movement of the mounting head is corrected based on the results of detection of the cameras. Such construction permits mounting of the circuit element on the printed circuit board to be accomplished with high accuracy. Also, this substantially eliminates an error of the circuit element mounting position caused due to misregistration between the conducting pattern of the printed circuit board and the positioning hole thereof and a variation in centering and optional turning of the circuit element. Such advantages are remarkably exhibited in mounting of a surface-mounting type circuit element in which an interval between lead wires is narrowed such as an FPP, a PLCC, an LCC, an SOIC or the like on the printed circuit board.

The centering of the circuit element is concurrently carried out with respect to four side surfaces of the circuit element. However, it may be carried out with respect to every two side surfaces of the circuit element in turn. Such centering effectively prevents deformation or bending of the lead wires of the circuit element because any lateral force is not applied thereto.

The construction of the centering and optional turning mechanism 7 will be described in detail with reference to FIGS. 10 to 16.

The centering and optional turning mechanism 7 includes a support frame 71 and a hollow shaft 72 rotatably supported on the support frame 71. In an upper opening of the hollow shaft 72 is inserted or fitted a circuit element support pin 73, which is upwardly biased by means of a compression spring 74 arranged in the hollow shaft 72, so that a cushioning effect may be produced on the circuit element support pin 73. The circuit element support pin 73 is adapted to place thereon a surface-mounting type circuit element having lead wires R1, R2, ... extending from four side portions thereof and securely hold it thereon by suction.

Figure 12:
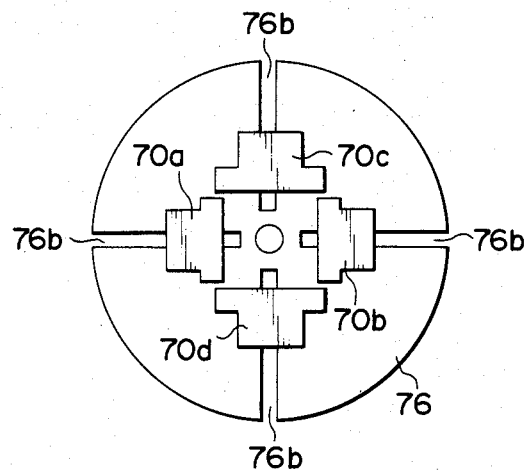
FIG. 12 is a plan view showing a claw holding plate and positioning claws of the centering and optional turning mechanism.

At an upper end of the hollow shaft 72 is horizontally fixed a claw holding plate 76 through a mounting member 75, and the circuit element support pin 73 is projected through a central hole 76a of the claw holding plate 76. The claw holding plate 76, as shown in FIG. 12, is formed with four slit-like cutouts 76b at angular intervals of 90°, at which four positioning claws 70a to 70d are arranged so as to be slidable on a horizontal plane, respectively.

Figure 10:
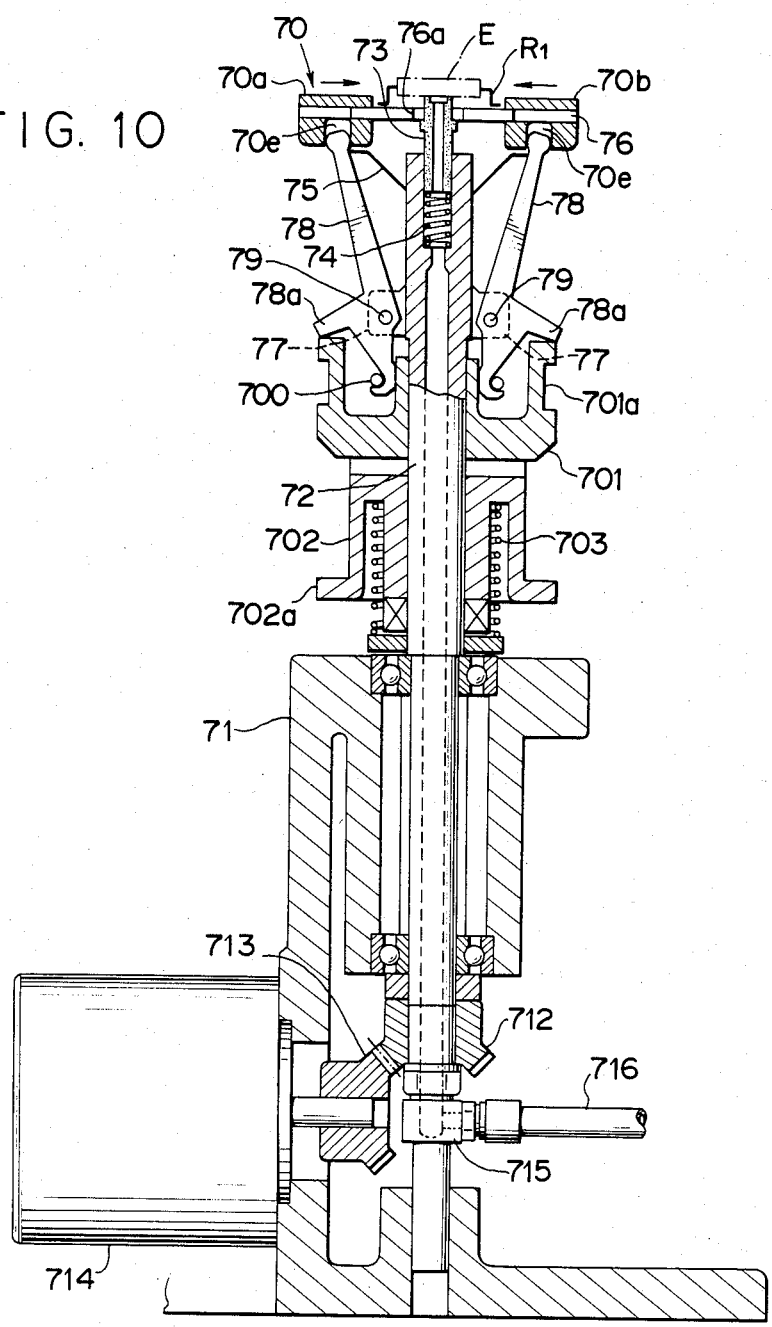
FIG. 10 is a sectional front elevation view showing a centering and optional turning mechanism.

Around an upper portion of the hollow shaft 72 are integrally formed four brackets 77 at equal intervals, to which levers 78 are pivotally connected through pins 79, respectively. The levers 78 each are engaged at a tip end thereof with each recess 70e of the positioning claws 70a to 70d. Only one pair of the levers 78 are shown in FIG. 10, however, the other pair of the levers are provided in a direction perpendicular to the drawing sheet. The levers 78 each are engaged at a lower end thereof with an annular spring 700, which acts to constantly force the levers 78 in a direction in which the tip ends or upper ends of the levers are kept apart from one another.

Also, the hollow shaft 72 has a first annular actuating member 701 fitted thereon so as to be vertically slidable thereon to actuate one pair of the levers 78 shown in FIG. 10. For the purpose, the annular actuating member 701 is engaged at an upper surface thereof with a projection 78a of each of the levers 78. More particularly, FIG. 10 shows a state that the annular actuating member 701 is at a lowermost position, wherein the distal ends of one pair of the levers 78 are kept apart from each other by the annular spring 700, resulting in the positioning claws 70a and 70b being kept apart from each other. When the annular actuating member 701 is moved to a raised position, the projection 78a of each of the levers 78 is pushed up, resulting in the positioning claws 70a and 70b being close to each other.

The hollow shaft 72 also has a second annular actuating member 702 movably fitted thereon so as to be vertically slidable thereon and positioned below the first annualr actuating member 701, which serves to actuate the other pair of the levers provided in a direction perpendicular to the paper of FIG. 10. The actuating member 702 is upwardly forced by means of a compression spring 703. In FIG. 10, the actuating member 702 likewise is at a lowered position, resulting in the positioning claws 70c and 70d being kept apart from each other. When the actuating member 702 is moved to a raised position, the other pair of the levers are pushed up, to thereby cause the positioning claws 70c and 70d to be close to each other.

Figure 11:
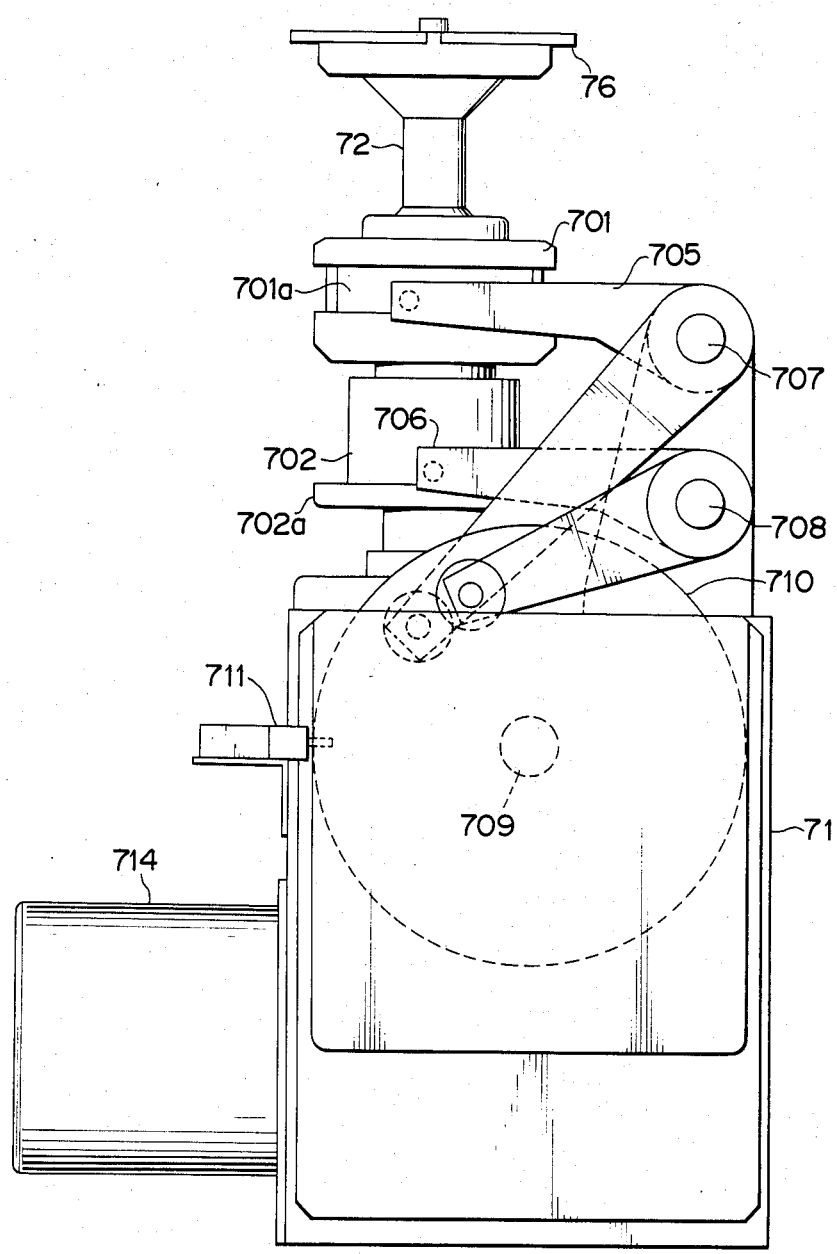
FIG. 11 is a front elevation view showing the centering and optional turning mechanism of FIG. 10.

As shown in FIG. 11, on the support frame 71 are pivotally supported bell cranks 705 and 706 through pins 707 and 708, which are adapted to act as a cam follower. The bell crank 705 is engaged at a distal end thereof with a groove 701a of the first annular actuating member 701 (FIG. 10) for actuating the positioning claws 70a and 70b, whereas the bell crank 706 is engaged at a distal end thereof with a flange-like engagement 702a of the second annular actuating member 702(FIG. 10) for actuating the positioning claws 70c and 70d. Also, the bell cranks 705 and 706 are abutting at lower ends thereof against cam grooves of a cam plate 710 rotated through a rotating shaft 709, respectively. Thus, the bell cranks 705 and 706 are pivotally moved with rotation of the cam plate 710 to vertically move the first and second annular actuating members 701 and 702. Vertical movement of the actuating member 701 is not carried out at the same timing as that of the actuating member 702, which will be described hereinafter. On the support frame 71 is fixed a sensor 711 for detecting a rotational position of the cam plate 710.

As shown in FIG. 10, the hollow shaft 72 has a bevel gear 712 fixed on a lower end thereof, which is engaged with a bevel gear 713 fixed on a rotating shaft of a motor 714 which is then securely mounted on the support frame 71. Rotation of the motor 714 causes the hollow shaft 72, and the claw holding plate 76 and positioning claws 70a to 70d mounted on the shaft 72 to be rotated by an optional angle.

Connected through a joint 715 to the hollow shaft 72 is a hose 716, of which a distal end is connected through a valve or the like to a vacuum pump (not shown). This causes suction force to be applied from the pump through the hose 716 and an interior of the hollow shaft 72 to the circuit element support pin 73.

Figure 14:
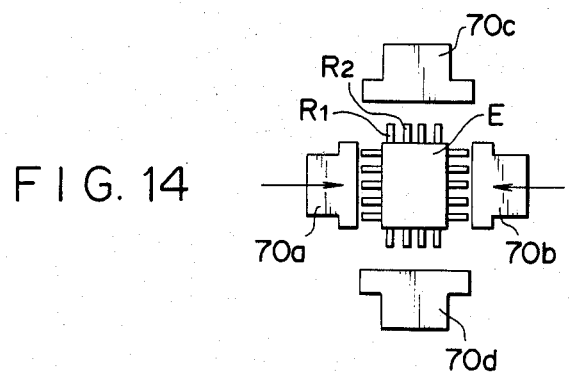
FIG. 14 to 16 each are a plan veiw showing operation of the centering and optional turning mechanism of FIG. 10.

In the circuit element centering and optional turning mechanism 7 constructed as described above, when the suction pin 47 of the circuit element mounting mechanism 4 carries a circuit element E to a space defined by the positioning claws 70a to 70d kept apart from one another, the circuit element support pin 73 upwardly projecting through the claw holding plate 76 holds the circuit element E thereon by suction. Then, as shown in FIG. 14, the positioning claws 70a and 70b are rendered close to each other to regulate distal ends of lead wires R1 and R2 extending from longer sides of the circuit element E. In other words, the distal ends of the lead wires are interposed between the positioning claws 70a and 70b.

Figure 15:
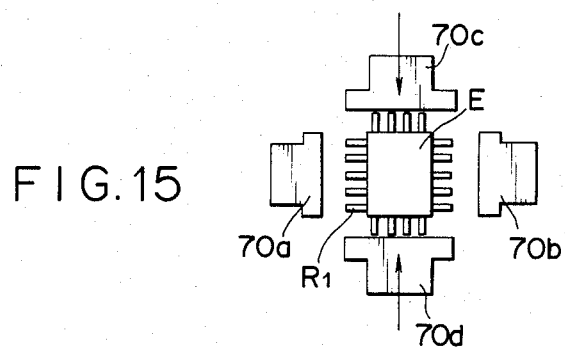

Then, the positioning claws 70a and 70b are actuated to be kept apart from each other as shown in FIG. 15, and then the other pair of the positioning claws 70c and 70d are actuated to be close each other, to thereby regulate or position distal ends of lead wires of the circuit element E extending from shorter sides of the circuit element. More particularly, the distal ends of the lead wires are securely interposed between the positioning claws 70c and 70d.

Figure 16:
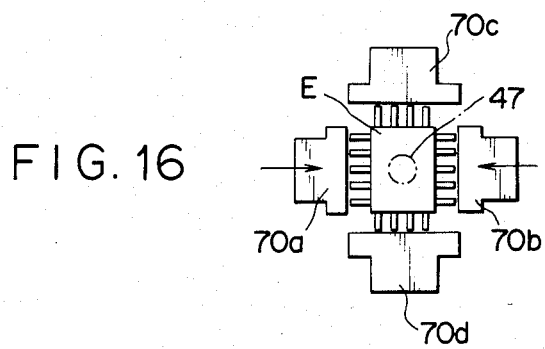

Subsequently, as shown in FIG. 16, the positioning claws 70a and 70b are rendered close to each other again while the positioning claws 70c and 70d are kept close to each other, so that the positioning claws 70a to 70d may interposedly hold the circuit element E therebetween. Then, vacuum suction applied to the circuit element support pin 73 from the vacuum pump (not shown) is stopped to cause a center portion of the circuit element E positioned by the positioning claws to be sucked by the suction pin 47.

Figure 13:
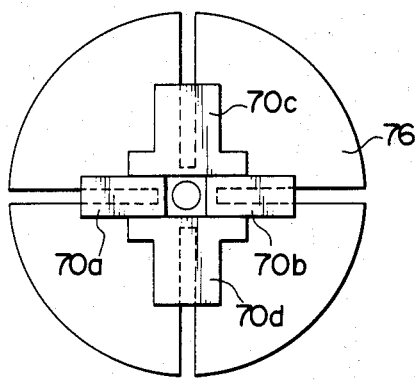
FIG. 13 is a plan view showing a modification of the positioning claws of FIG. 12.

Configuration of the positioning claws 70a to 70d may be varied depending upon a shape or dimensions of a circuit element. For example, when a circuit element is small-sized, the positioning claws 70a and 70b, as shown in FIG. 13 may be formed to have a width smaller than the positioning claws 70c and 70d. Also, in the illustrated embodiment, the circuit element is positioned through the lead wires. However, the positioned may be carried out through a body of the circuit element.

Thus, the circuit element positioning mechanism 7 is so constructed that the four positioning claws arranged opposite to the four side portions of the circuit element having lead wires carry out positioning of the circuit element in the manner tha one pair of the positioning claws interposedly hold two parallel side portions of the circuit element therebetween and then are separated from each other, and thereafter the other pair of the positioning claws securely interpose the remaining two parallel side portions of the circuit element therebetween. Such construction of the mechanism effectively prevents lateral force from being applied to the lead wires of the circuit element, to thereby prevent deformation or bending of the lead wires. This results in a failure in the mounting of the circuit element on the printed circuit board being eliminated.

Also, such construction, when the circuit element is a surface-mounting type one having a plurality of lead wires provided on each of four side portions thereof, allows a state of projection of the lead wires to be also detected or inspected during the lead wire detection or inspection described above.

Figure 17:
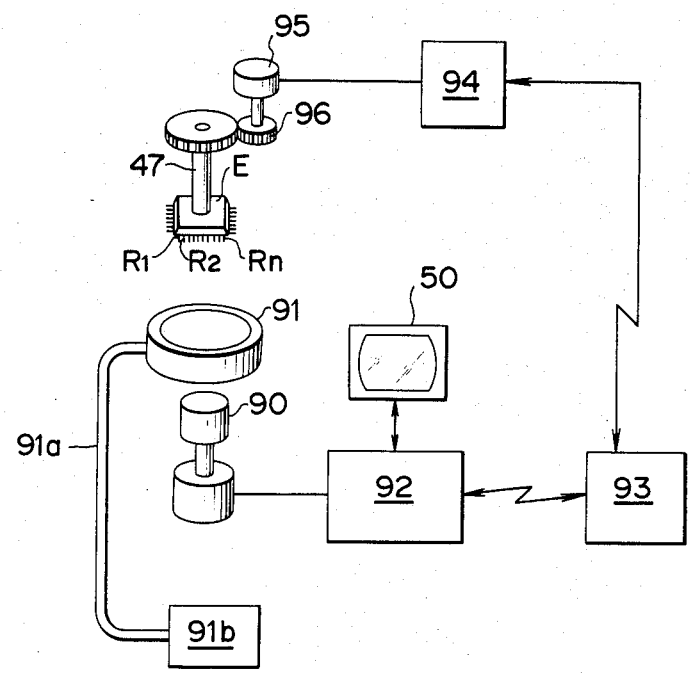
FIG. 17 is a schematic view showing a manner of inspection or detection of lead wires.
Figure 18:
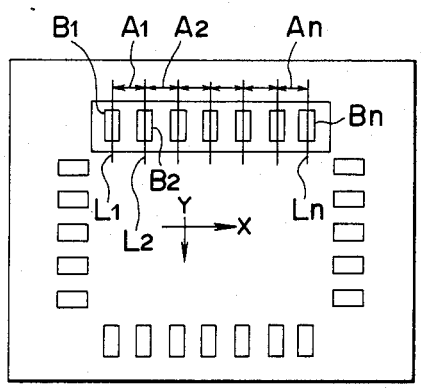
FIG. 18 is a schematic view showing image processing in the lead wire detection.
Figure 19:
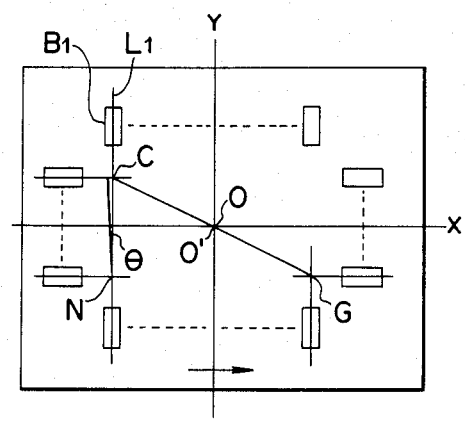
FIG. 19 is a schematic view showing image processing in inspection or detection of misregistration a circuit element and a mounting head in holding of the circuit element on the mounting head by suction.

The lead wire detection or inspection may be carried out using an inspection mechanism constructed as shown in FIGS. 17 to 19. Prior to the inspection, a position of a circuit element E held on the suction pin 47 is regulated by the centering and optional turning mechanism shown in FIGS. 10 to 16, so that the circuit element E may be held on the suction pin 47 at a state of being previously aligned with an axis of the suction pin 47. To the so-held circuit element E is irradiated by a light source 91 arranged immediately below the circuit element, so that reflection of light from lead wires R1, R2, . . . Rn of the circuit element E is captured by means of the camera receiver 90. As the light source 91 is preferably used a ring-like illuminating lamp, because it carries out uniform irradiation to all the lead wires R1, R2, . . . Rn provided around the circuit element E. For this purpose, a halogen lamp 91b may be connected through an optical fiber 91a to the light source 91. When the camera receiver 90 detects reflection of light from the lead wires R1, R2, . . . Rn, the TV 50 converts an electrical signal into a binary signal through a picture processing unit or mechanism 92 to display thereon a brilliant picture corresponding to each of the lead wires. The pictures are displayed in a manner to be arranged in X and Y directions of a telescreen of the TV as shown in FIG. 18. In this instance, when the lead wires have any defect, the TV fails to project or display any picture thereon or display a picture of which dimensions are different from normal lead wires, resulting in defectiveness of the circuit element being detected. Also, this permits deformation of the lead wires such as bending to be effectively detected.

In the inspection, the picture processing unit 92 and a numerical operation control unit 93 are used to find axial centers L1, L2, . . . , Ln within widths of areas of optical imags B1, B2, . . . , Bn at every row of each of X and Y directions on a telescreen of the TV 50. Then, pitch intervals A1, A2, . . . , An between the respective adjacent two axial centers L1, L2, . . . , Ln are found in turn and then the average value of the pitch intervals A1, A2, . . . , An is calculated. The average value corresponds to a predetermined pitch interval between the lead wires of the circuit element even if one of the lead wires is bent, accordingly, whether the lead wires are bent or deformed is judged due to an operation for comparison between the average and each of the pitch intervals A1, A2, . . . , An. When any bending or deformation is detected, whether it is within a predetermined tolerance is judged. When it is out of the tolerance, a rejection command is supplied to the suction pin 47 to prevent the circuit element from being mounted on a printed circuit board. The inspection procedures are applied to each lead wire row in the X and Y directions in the same manner, so that only an indefective circuit element may be mounted on a printed circuit board.

When carrying out, through the TV 50, inspection of misregistration between the suction pin 47 and a circuit element held thereon in addition to the above-described lead wire inspection, a center O in the X and Y directions, as shown in FIG. 19, is preset on the telescreen of the TV 50 and then comparison of positional relationship between the center O and an optical image obtained from each of the lead wires is made to carry out the inspection. More particularly, intersections C, G and N between the center lines of the adjacent end lead wires of the adjacent lead wire rows at three corners of the respective lead wire rows arranged in the X and Y directions are found utilizing their optical images. Then, a center O' of the circuit element is found using the intersections C and G and a positional error between the centers O' and O is obtained on the basis of X and Y coordinates, resulting in misregistration between the center of the suction pin 47 and that of the circuit element held thereon being detected or measured. Actuation of the centering and optional turning mechanism depending on a result of the measurement permits precise centering of the circuit element held on the suction pin 47. Then, axial center lines of the lead wires of the two lead wire rows arranged in the X or Y direction are connected to each other utilizing optical images thereof, so that deviation of rotational direction of the circuit element may be detected due to misregistration between each of the connected axial center lines and the central line in the X or Y direction. When any deviation of the rotation angle $\theta$ is detected according to the procedures described above, the numerical operation control unit 93 actuates a pulse motor 95 through a pulse motor controller 94 to rotate a gear 96 engaged with the suction head 47 by an angle corresponding to the angle $\theta$, so that a direction of the circuit element held on the suction head 47 may be corrected.

Thus, the lead wire inspection or detection mechansim is capable of carrying out the inspection for every circuit element, so that the mounting head may accomplish mounting of a circuit element on a printed circuit board with extremely high precision. This results in highly troublesome recorrection of the circuit element which is required after fixing of the circuit element by soldering in the prior art being eliminated.

The above-described mounting reference mark M on the circuit element P, when the conducting pattern is formed of copper on the printed circuit board by printing, may likewise be formed of the same material as the conducting pattern by printing. In this instance, in order to prevent oxidation of the reference mark, solder is plated on a surface of the mark as well as the conducting pattern.

However, the solder formed on the mounting reference mark generally fails to have a uniform surface. Accordingly, when light is irradiated to the printed circuit element from a single light source arranged above the printed circuit board, irregular reflectional occurs on the surface of the solder to fail to display a correct configuration of the printed circuit board on the TV display, thus, an image displayed on the TV display cannot be used as a control data for correcting misregistration of the printed circuit board.

It has been found that such a problem is solved by a substrate misregistration correcting process which is adapted to radially irradiate light to the whole surface of the mounting reference mark formed of the same material as the conducting pattern, display a random optical image of the mark on the telescreen of the TV display through the camera, preset an outer frame line and a center of a reference pattern corresponding to the mounting reference mark at a central position of the telescreen of the TV display, align the random optical image of the mounting reference mark displayed on the telescreen with the outer frame line of the reference pattern by vertical or up-down adjustment of a binary lever, compare a center of the optical image coincided with the reference pattern with the center of the reference pattern set on the telescreen of the TV display, and detect misregistration in the X and Y directions between the centers by means of coordindates of the telescreen to adjust a positional correlation between the mounting head and the printed circuit board.

Thus, in the substrate misregistration correcting process as described above, a large amount of light is radially irradiated to the mounting reference mark to display the random optical image on the telescreen of the TV display and the optical image is coincided with the outer frame line of the predetermined reference pattern by up-down adjustment of a binary level, resulting in the mounting reference mark being optically detected. Accordingly, such process allows a positional correlation between the mounting head and the printed circuit board to be precisely corrected even when a solder is applied to the reference mark by plating.

Now, the substrate misregistration correcting process will be described hereinafter with reference to FIGS. 20 to 30.

In the substrate misregistration correction, a positional correlation between a printed circuit board P placed on the belt conveyor 21 (FIG. 1) of the substrate carrying mechanism and the mounting head 46 for mounting a circuit element on the printed circuit board P is corrected by movement of the mounting head in the X and Y directions, to thereby cause a circuit element to be precisely mounted on a predetermined position of the conducting pattern of the printed circuit board. Also, irradiation of light is carried out with respect to the mounting reference mark M formed of copper which is the same material as the conducting pattern, so that light reflected on the mark is used to form the optical image which is then subjected to image processing to obtain a data for positional correction of the mounting head 46.

The image processing may be carried out using a system shown in FIGS. 20 and 21. More particularly, the system is adapted to reflect light emitted from an incadescent lamp 82 connected to an electric source 81 on a mirror 83 to irradiate the light to a substantially central portion of a mounting reference mark M of a printed circuit board P. Also, the system is adapted to irradiate light to the mounting reference mark M from a plurality of LED lamps 85 connected to an electric source 84. The LED lamps 85, as shown in FIG. 22, are preferably arranged in a manner to be substantially concentric with the mounting reference mark M to radially irradiate a large amount of light to the reference mark M from the lamps 85 as well as the incadescent lamp 82. The light reflected on the reference mark M is guided through a lens 86 to the camera 80 and then supplied through the image processing unit 92 operated by an operator to the TV receiver 50. The image processing unit 92 is connected to the numeral operation control unit 93 and the TV receiver 50, as shown in FIG. 23, has a reference pattern preset in X and Y directions thereon which comprises a center O and an outer frame line F of widths W1 and W2 corresponding to the mounting reference mark M formed on the printed circuit board P by printing.

Figure 24:
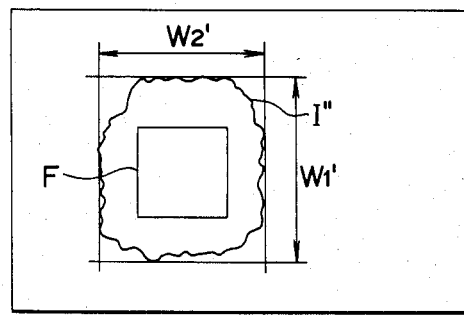
FIG. 24 to 29 each are a schematic view showing image processing by the TV projector of FIG. 23.
Figure 25:
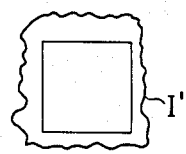
Figure 26:
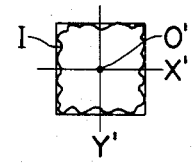
Figure 27:
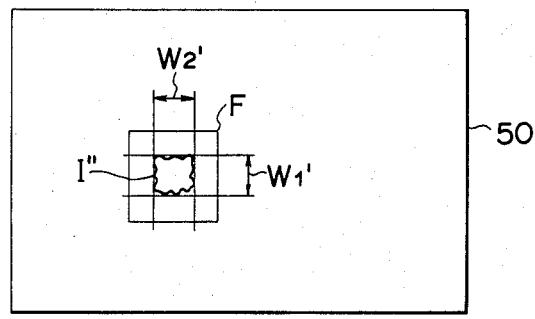
Figure 28:
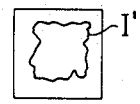
Figure 30:
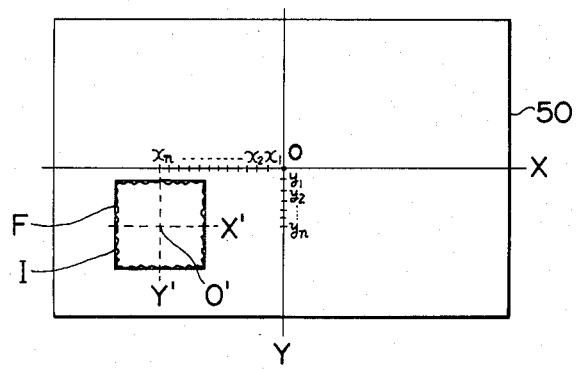
FIG. 30 is a schematic view showing mistregistration data operation depending on coordinates by the TV projector of FIG. 23.
Figure 29:
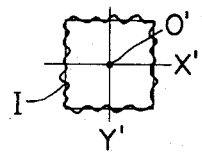

The image processing system is adapted to display an optical image I, which is formed by the reflected light of the reference mark of the printed circuit board randomly captured by the camera 80, on the telescreen of the TV receiver 50 at a binary level by means of an electrical signal and judge, by operator's observation through the numerical operation control unit 93 and TV receiver 50, whether an optical image I″ prior to adjustment as described hereinafter coincides with the outer frame line F of the reference pattern. When the optical image I″ overflows the outer frame line F of the reference pattern as shown in FIG. 24, it is narrowed, by down adjustment of the binary level, through an optical image I′ (FIG. 25) to an optical image I (FIG. 26) which substantially coincides with the outer frame line F of the reference pattern In X′ and Y′ directions while being displayed on the telescreen of the TV receiver 50. On the contrary, when the optical image I″ randomly captured by the camera 80 is displayed in a reduced-size manner within the outer frame line as shown in FIG. 27, it is gradually enlarged by adjustment of the binary lever through an optical image I′ (FIG. 28) to an optical image I (FIG. 29) which coincides with the outer frame line F of the reference pattern in the X′ and Y′ directions while being displayed on the telescreen of the TV receiver 50. Also, a center O′ of each of the so-obtained optical images I coinciding with the outer frame line F of the reference pattern is found through the numerical operation control unit 93 and the TV receiver 50 by an operator, and the number of differences based on coordinates x1, x2, . . . , xn, y1, y2, . . . , yn between each of so-obtained centers O′ and O′ and the predetermined center O of the reference pattern is calculated through the picture processing unit 92 serving as an image sensor and the numerical operation control unit 93 to obtain the amount of misregistration therebetween. Based on the so-obtained misregistration data, the mounting head 46 is positionally adjusted in relation to the printed circuit board placed on the conveyor and then lowered to mount the circuit element held thereon the printed circuit board, so that the circuit element may be precisely positioned with respect to the conducting pattern on the printed circuit board and fixed thereon by soldering.

Thus, the substrate misregistration correcting process allows data for positioning the printed circuit board to be precisely obtained although the printed circuit board placed on the conveyor is positioned depending upon the mounting reference mark formed of the same material as the conducting pattern, so that surface-mounting of the circuit element on the printed circuit board may be carried out with extremely high precision.

In the automatic circuit element mounting apparatus, it is desired that the tray feeder 30 briefly described above is constructed to readily cope with a variation in intervals of arrangement of surface-mounting type circuit elements on the tray 32 which is caused due to a change of the circuit elements, because intervals of arrangement of the circuit elements on the tray 32 are varied depending on their shape. Also, in such an automatic mounting apparatus, a plurality of trays are arranged in a stacked manner so that empty trays from which circuit elements have been removed are automatically taken out.

For this purpose, the tray feeder 30 constructed as shown in FIGS. 31 to 35 may be employed for the automatic circuit element mounting apparatus of the illustrated embodiment.

Figure 32:
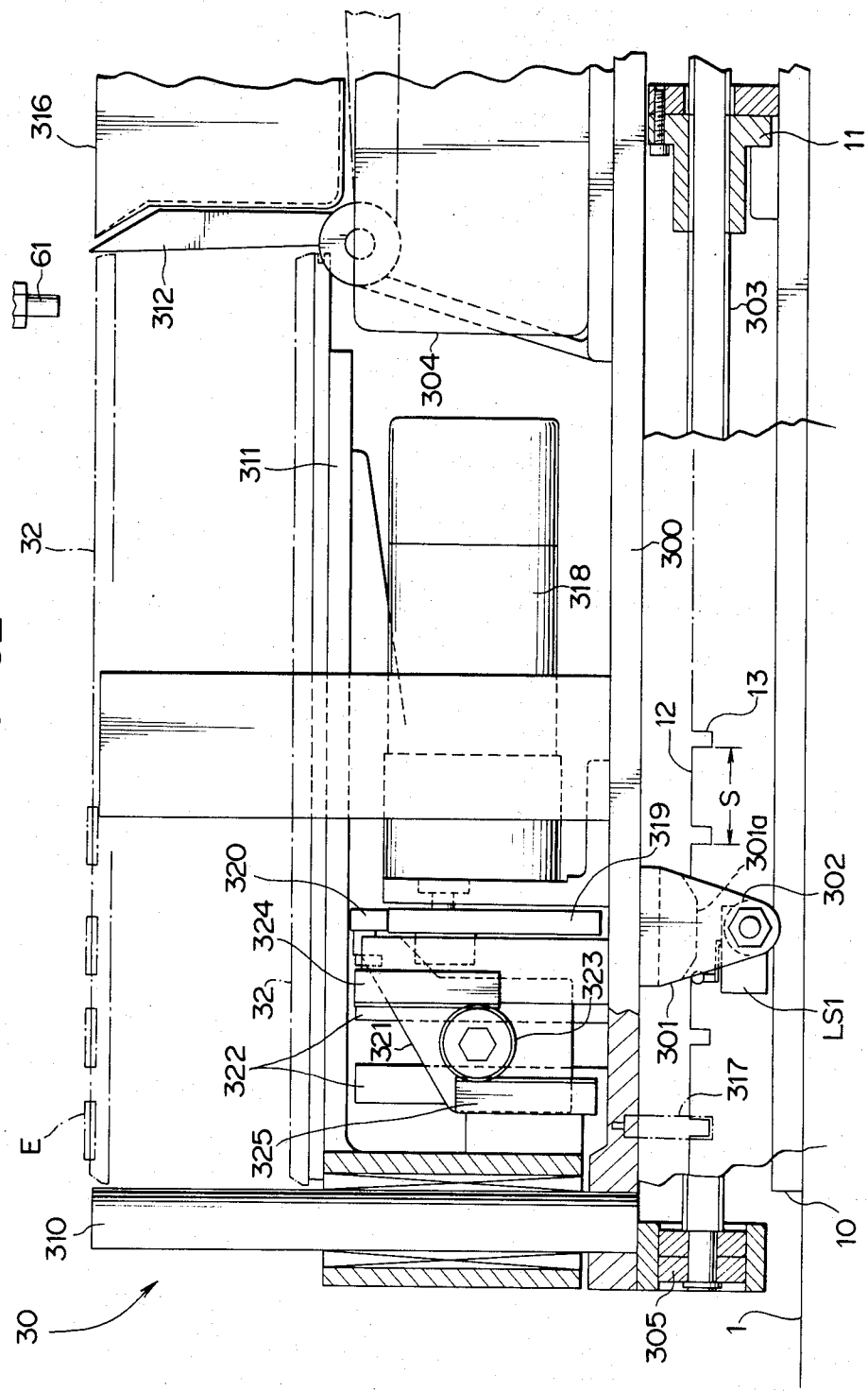
FIG. 32 is a front elevation view partly in section showing an essential part of the tray carrying unit shown in FIG. 31.

More particularly, the tray feeder 30 includes a pair of rails 10 mounted on the base 1 as shown in FIGS. 31 and 32. Also, the unit includes a support 300 which has four brackets 301 fixed on a lower surface thereof. The brackets 301 each have a roller 301 rotatably mounted thereon through which the unit is moved along the rails 10. In FIG. 31, an arrow Y indicates a direction of forward movement of the unit.

The tray carrying unit also includes a means for moving the support 300, which comprises a ball thread shaft 303 provided below the support 300 and a motor 304 mounted on the support. More particularly, the ball thread shaft 303 are rotatably supported at both ends thereof on bearings 305 and 306 fixed on a lower surface of the support 300 and the motor 304 is securely mounted on the support 300. The ball thread shaft 303 and a rotating shaft of the motor 304 have belt pulleys 307 and 308 fixed thereon, respectively, between which a timing belt 309 is stretched. The ball thread shaft 303 is engaged at a middle portion thereof with an internally threaded member 11 fixed on the base 1. Thus, when the motor 304 is driven, rotating force of the motor is transmitted through the belt pulley 308, timing belt 309 and belt pulley 307 to the ball thread shaft 303, so that a positional relationship of the ball thread shaft 303 to the internally threaded member 11 may be varied to cause the support 300 to be moved on the rails 10 with respect to the stationary base 1.

On the support 300 are fixedly mounted two vertically extending guide shafts 310 which are arranged in a direction perpendicular to that of movement of the tray carrying unit. Accordingly, only one shaft 310 is shown in FIGS. 31 and 32. On the guide shafts 310 is vertically slidably supported an elevator 311.

In the illustrated embodiment, a tray 32 is formed into a rectangular shape and formed with a plurality of recesses for placing therein surface-mounting type circuit elements E at regular intervals. A plurality of the trays 32 (for example, ten such trays) each having a plurality of the circuit elements positioned thereon are placed on the elevator 311 in a stacked manner. On the support 300 is pivotally mounted a holding member 312 through a brace 313 at a position in proximity to a distal end of the elevator 311, which serves to hold an uppermost tray so as to prevent it from moving.

The tray carrying unit also includes a tray taking-out head 314 fixedly mounted on the base 1 so that it may be opposite to the tray 32 when the supporting 300 is moved in a rearward direction opposite to the forward direction indicated by the arrow Y in FIG. 31. The tray taking-out head 314 has a suction pin 315 mounted at a lower end thereof in a manner to be vertically movable, which serves to hold the tray 32 thereon by suction. Vertical movement of the suction pin 315 may be carried out by means of, for example, an air cylinder or the like.

Also, on the support 300 is securely mounted a tray discharge box or frame 316 at a position behind the elevator 311.

The aforementioed circuit element extracting head 60 is arranged opposite to the trays 32. The extracting head 60 is adapted to be moved not in the direction indicated by the arrow Y but in a direction perpendicular to the Y direction or indicated at X in FIG. 31. The suction pin 61 of the head 60 is vertically movable.

In addition, the tray carrying unit, as shown in FIG. 32, includes a positioning plate 12 mounted on the base 1 to extend over a range of movement of the support 300. The positioning plate 12 serves to forward move the supprot 300 by a distance corresponding to the interval between the circuit elements arranged on the tray. The positioning plate 12 is formed with a plurality of recess 13 each having a width corresponding to the interval S between the circuit elements. The recesses 13 are optically, magnetically or mechanically detected by a sensor 317 fixedly mounted on the support 300.

Further, the tray carrying unit, as shown in FIG. 31, includes limit switches LS1, LS2 and LS3 arranged on the base 1 along the rails 10 in turn. The limit switches L1, L2 and L3 are adapted to detect a first stop position or foremost stop position of the support 300, a second stop position or rearmost stop position thereof, and a third stop position thereof or a stop position of the support 300 slightly in front of the rearmost stop position, respectively. For this purpose, the limit switches are positioned corresponding to these stop positions, respectively. The foremost stop position corresponds to a position at which the circuit element extracting head 60 holds each of circuit elements of a rearmost row thereon, and the rearmost stop position corresponds to a position at which the tray taking-out head 314 holds thereon an empty tray from which circuit elements are removed by the extracting head 60. The third stop position correspond to a position at which the head 60 holds thereon each of circuit elements of a foremost row by suction. The limit switch LS1 is actuated when a projection 301a provided on an inside of the front bracket 301 is abutted against the switch, and the limit switches LS2 and LS3 each are actuated by a projection on an inside of the rear bracket 301.

As shown in FIG. 32, on the support 300 is mounted a motor 318 for the purpose of vertically moving the elevator 311. The motor 318 has an eccentric disc-like cam 319 fixed on a rotating shaft thereof. Against the cam 319 is abutted a roller 320 which serves as a cam follower. The roller 320 is pivotally mounted on a vertically movable slider 321. The slider 321 is vertically movably supported on slider bearings 322 fixed on the support 300 so as to upwardly extend therefrom. Also, the slider 321 has a pinion 323 rotatably mounted thereon, which is adapted to be engaged with a rack 324 vertically mounted on the support 300 and a rack 325 fixed on the elevator 311 and arranged in parallel with the rack 324. The so-constructed pinion and rack mechanism serves to enlarge vertical movement of the roller 320.

Accordingly, when the motor 318 is driven in order to vertically move the elevator 311 from a position shown in FIG. 32, the cam 319 is rotated and the slider 321 is raised together with the roller 320, so that the pinion 323 may be rotated in a right or clockwise direction in FIG. 32 because the right-side rack 324 is stationary. Such rotation of the pinion 323 causes the left-side rack 325 to be raised by a distance corresponding to a thickness of the tray 32.

Now, the manner of operation of the tray carrying unit will be described hereinafter with reference to FIGS. 31 to 35.

An arrow Z above the trays 32 in FIG. 31 indicates a range at which the circuit element extracting head 60 takes out a circuit element E from the tray. When starting supply of circuit elements on the uppermost tray 32, the support 300 is at the rearward position at which the rear bracket 301 actuates the limit switch LS3, resulting in the extracting head 60 being positioned above a left end of the range Z or circuit elements of the foremost row on the tray 32. As described above, the head 60 is not adapated to be moved in the direction indicated at the arrow Y in FIG. 31. Then, the head 60 is lowered to hold a circuit element thereon by suction, raised, and then moved in the X direction perpendicular to the Y direction to carry out the circuit element extracting operation.

When supply of the circuit elements of the foremost row on the tray is completed, the motor 304 is driven to rotate the ball thread shaft 303 to cause a positional relationship of the ball thread shaft 303 to the internally threaded member 11 to e varied, resulting in forward movement of the support starting. Then, when the sensor 317 detects the recess 13 of the postiioning plate 12 which coincides with the interval S between the circuit elements, actuation of the motor 304 is stopped. This causes the support 300 to be forward moved by a distance corresponding to the inverval S, resulting in circuit elements of a second row on the tray being positioned opposite to the extracting head. Then, the head take out the circuit elements of the second row from the tray in turn.

The same operation is repeated to carry out extraction of circuit elements of third to rearmost rows in turn.

Figure 33:
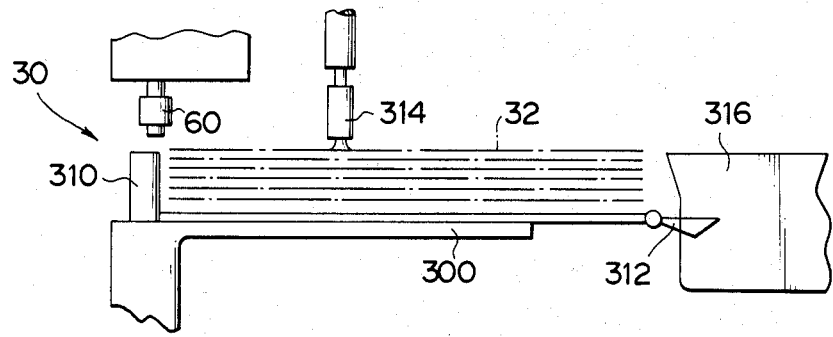
FIG. 33 to 35 each are a front elevation view showing operation of the tray carrying unit shown in FIG. 31.

Subsequently, the support 300 is moved to the rearmost stop position at which the rear bracket 301 actuates the limit switch LS2. This causes the head 60 to be at a position out of the left end of the tray 32 as shown in FIG. 33 and the holder 312 to pivotally fall sideways, to thereby be released from engagement with the tray. Then, the tray taking-out head 314 is lowered, actuated to hold the uppermost tray thereon by suction and then raised. Then, the holder 312 is pivotally moved to its original postion to hold the remaining trays 32 on the elevator 311 in turn.

Figure 34:
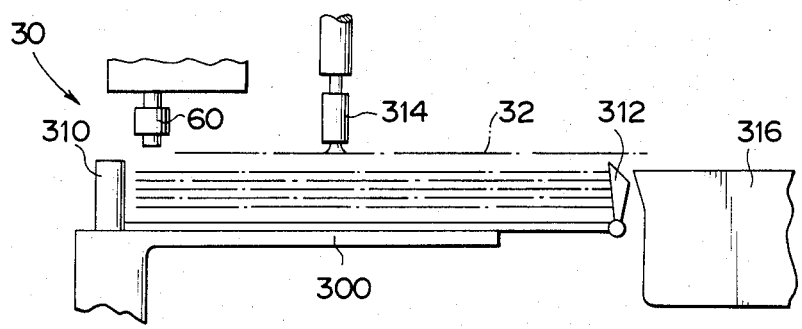

Thereafter, the support 300 is moved to the slightly forward position at which the rear bracket 301 actuates the limit switch LS3, so that the circuit element extracting head 60 is positioned opposite to circuit elements E of a foremost row on a second tray as shown in FIG. 34. When the motor 318 starts, the cam 319 is rotated to upwardly move the slider 321 and rotate the pinion 323 to raise the rack 325, so that the elevator 311 may be raised by a distance corresponding to a thickness of one tray, resulting in the second tray being lifted to a level at which the removed uppermost tray was positioned. Then, the extracting head 60 starts taking-out of circuit elements of a foremost row on the second tray. Circuit elements of second to rearmost rows are extracted from the tray in turn in the same manner as described above.

Figure 35:
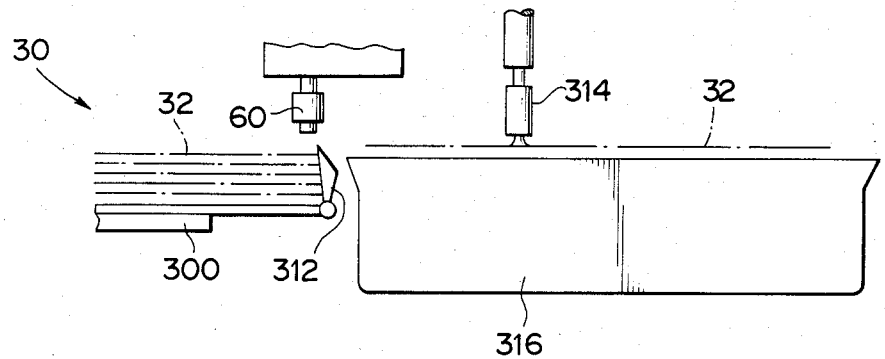

At a state shown in FIG. 35 that all circuit elements on the second tray 32 have been taken out and the support 300 is at the foremost position, the uppermost tray is positioned above the tray discharge box 316. Then, suction of the tray by the tray taking-out head 314 is released to drop it into the box 316.

Then, the support 300 is returned to a state shown in FIG. 33 and the tray taking-out head 314 holds the second tray thereon by suction. Subsequently, the extracting head 60 carries out extraction of circuit elements on a third tray in a manner described above.

In the tray carrying unit described above, the positioning late 12 formed with a marking which comprises the recesses 13 each having a width coinciding with the interval S between the circuit elements are used as a positioning means. However, the marking may comprise projections or holes instead of the recesses 13.

As described above, the tray carrying unit is so constructed that the elevator on which the trays are placed is carried on the support horizontally movable on the rails, to thereby permit the circuit element extracting head to accomplish the extraction at constant positions. Also, exchange of the positioning means provided with the marking coinciding with the intervals between the circuit elements arranged on the tray permits a distance of movement of the tray to be varied as desired. Further, the tray taking-out head allows empty trays from which circuit elements have been removed to be automatically taken out at high efficiency, because the taking-out can be carried out in parallel with supply of circuit elements.

Figure 36:
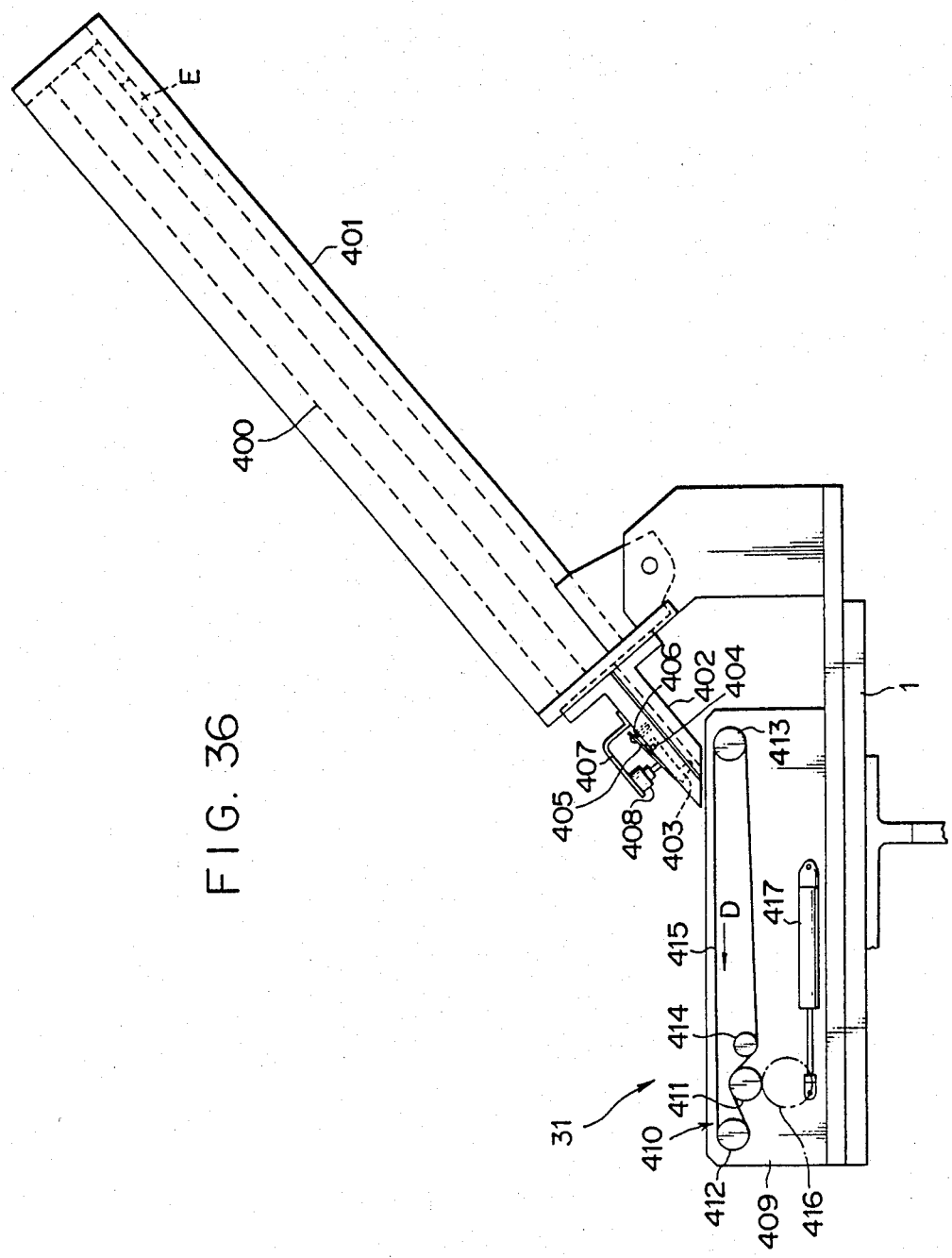
FIG. 36 is a side elevation view showing a stick feeder used for supply of a circuit element.
Figure 37:
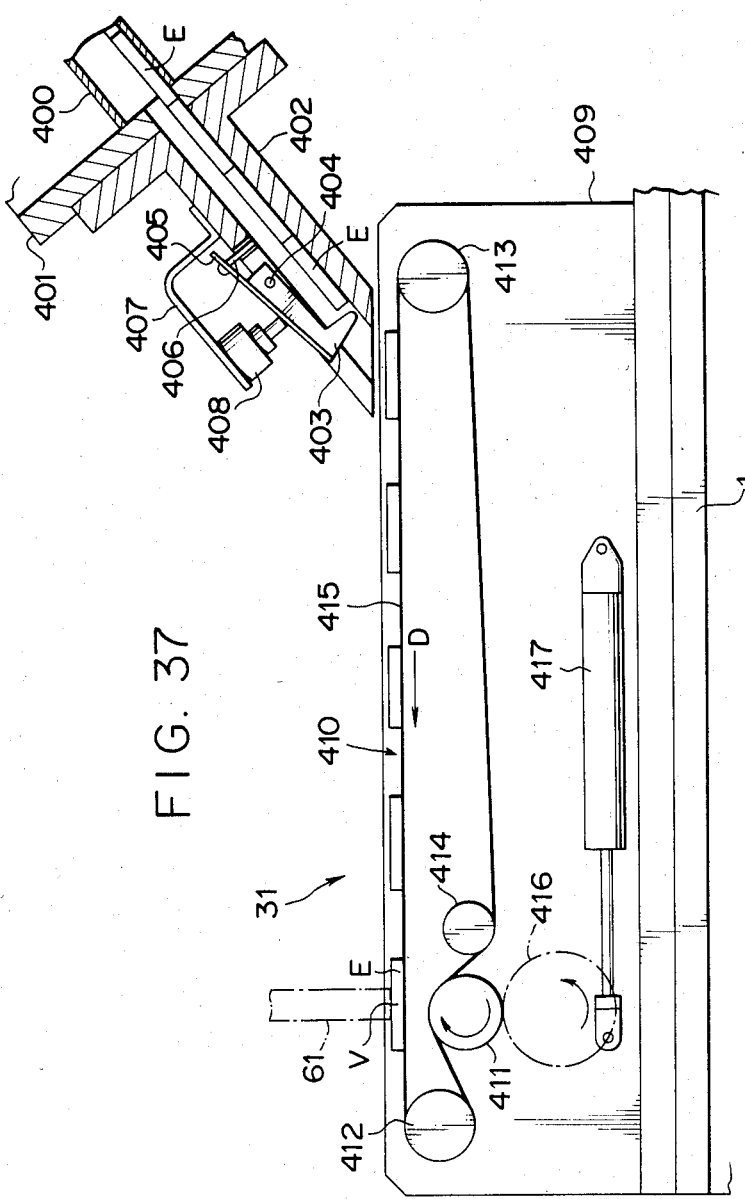
FIG. 37 is a sectional side elevation view showing an essential part of the stick feeder shown in FIG. 36.

In the illustrated embodiment, the stick feeder 31 briefly described above may be constructed in such a manner as shown in FIGS. 36 and 37.

More particularly, the stick feeder 31 includes a magazine support frame 401 which is mounted on the base 1 and adapted to support thereon a plurality of circuit element magazines 400 in a stacked manenr. The amgazine 400 each are formed of plastic, metal or the like into a cylindrical shape and adapted to receive therein circuit elements E in a row. The magazine support frame 401 is obliquely supported on the base 1 at an angle of about 45° during supply of the circuit elements E.

The magazine support frame 401 has a chute 402 fixed on a front end thereof. The chute 402 is formed therein with a circuit element passage which is inclined at an angle of about 45° and communicated with lowermost one of the magazines 400. The chute 402 has a pawl member 403 pivotally mounted thereon through a pin 404 above the passage. The pawl member 403 is integrally attached thereto a leaf spring 405 having a rear end to which a clamp pin 406 is fixed. On an upper portion of the chute 402 is mounted a small-sized air cylinder 408 through a support member 407. The air cylinder 408 has a rod which serves to push down a distal end of the pawl member 403 when it is extended. The pawl member 403 is provided with a spring (not shown) which acts to push up the distal end of the pawl member 403 to open the circuit element passage when the rod of the cylinder 408 is contracted.

The stick feeder also includes a conveyor support frame 409 mounted on the base 1, on which a belt conveyor 410 is horizontally arranged. More particularly, on the conveyor support frame 409 are rotatably mounted a plurality of belt pulleys 411 to 414, around which a belt 415 is passed. The pulely 411 is adapted to receive driving force of an air cylinder 417 through a ratchet wheel 416. More particularly, one stroke of contraction of the air cylinder 417 causes the pulley 411 to be rotated by a predetermined amount in a clockwise direction in FIGS. 36 and 37 through the ratchet wheel 416, resulting in the belt 415 being forward rotated by a predetermined amount in a direction indicated by an arrow D in FIG. 37. When the air cylinder 417 returns to its original position due to extension, the ratchet wheel 416 does not transmit rotating force to the pulley 411, resulting in the belt 415 being stopped. Thus, the belt 415 is intermittently driven.

In the stick feeder constructed as described above, when a circuit element at the circuit element extracting position V on the belt 415 is held on the suction pin 61 so as to be transferred to the centering and optional turning mechanism, the air cylinder 417 is contracted to cause the belt 415 to be forward rotated through the ratchet wheel 416 and pulley 411 in a predetermined amount. This causes the next circuit element to be carried to the circuit element extracting position V, resulting in a portion of the belt 415 positioned below a lower end of the chute 402 being free of a circuit element. In order to cope with such a situation, the air cylinder 408 is contracted to raise the distal end of the pawl member 403, to thereby open the passage of the chute 402. This leads to dropping of a lowermost circuit element E onto the belt 415 by its own weight. At this time, the clamp pin 406 attached to the rear end of the leaf spring 405 is pushed down to clamp or hold down the next circuit element positioned on the lowermost one, to thereby prevent the two circuit elements from dropping onto the belt 415 together. When the lowermost circuit element is dropped onto the belt as described above, the air cylinder 408 is actuated to extend the rod, so that the pawl member 403 may be pushed down to release the next circuit element from the clamping by the clamp pin 406. This results in the next circuit element being transferred to the lowermost position and held there by means of the pawl member 403.

The operation described above is repeated to cause the circuit elements in the magazine 400 to be dropped through the chute 402 onto the belt 415 one by one and carried to the circuit element extracting position V due to intermittent movement of the belt 415.

As described above, the stick feeder is constructed in the manner that transportation of the circuit elements to the circuit element extracting position is carried out by the belt conveyor, so that the chute which provides the passage communicated with the magazine may be constructed with a simple structure. Also, the belt conveyor is applicable to various kinds of circuit elements without any modification, so that the stick feeder may be provided with good general-purpose properties.

Figure 39:
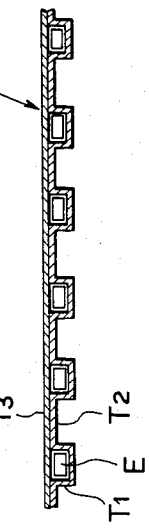
FIG. 39 is a sectional front elevation view showing the circuit element train of FIG. 38.
Figure 38:
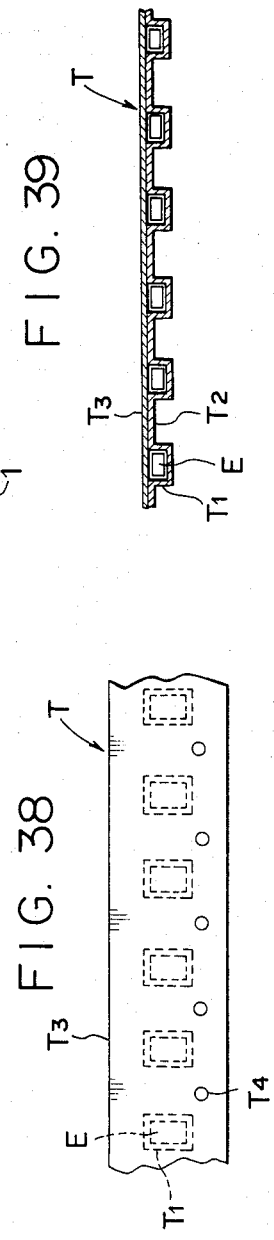
FIG. 38 is a plan view showing a train of circuit elements supplied by a tate feeder.

As briefly described above, in the automatic mounting apparatus of the illustrated embodiment, a tape feeder may be used instead of the stick feeder described above, which tape feeder is adapted to handle a train of circuit elements (hereinafter referred to as "circuit element train") as shown in FIGS. 38 and 39. In FIG. 38 and 39, a circuit element train generally designated at reference character T comprises a plurality of circuit elements E, an elongated storage tape T2 formed with a plurality of recesses T1 at equal intervals in which the circuit elements E are received, and a cover tape T3 for covering the recesses T1. The cover tape T3 is bonded to the storage tape T2 by thermocompression bonding, mechanical bonding or the like. The circuit element train is formed with perforations T4 at equal intervals.

A tape feeder for handling such a circuit element train may be constructed in such a manner as shown in FIGS. 40 to 48.

Figure 40:
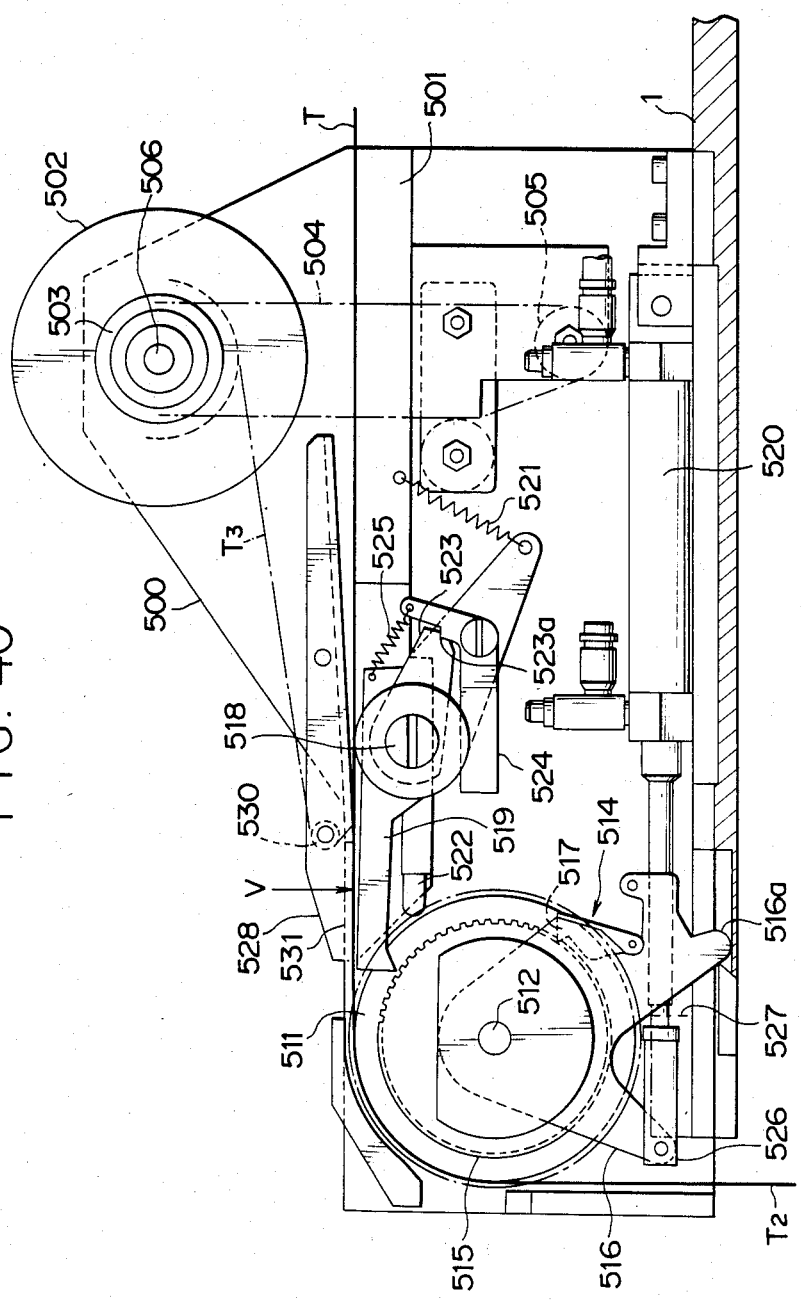
FIG. 40 is a front elevation view showing a tape feeder.

FIG. 40 shows a general structure of the tape feeder. The tape feeder includes a support frame 500 mounted on the base 1. On the support frame 500 is horizontally fixed a travel guide 501, on which the circuit element train T drawn out from a supply reel (not shown) is supported so as to be horizontally movable.

The tape feeder also includes a take-up reel 502 rotatably supported on the support frame 500 in a manner to be upwardly projected from the frame 500. The take-up reel 502 serves to wind up the cover tape T3 peeled off from the storage tape T2. The take-up reel 502 is connected through a pulley 503, a belt 504 and a pulley 505 to a driving source (not shown) so that driving force of the driving source may be transmitted to the reel 502.

Figure 42:
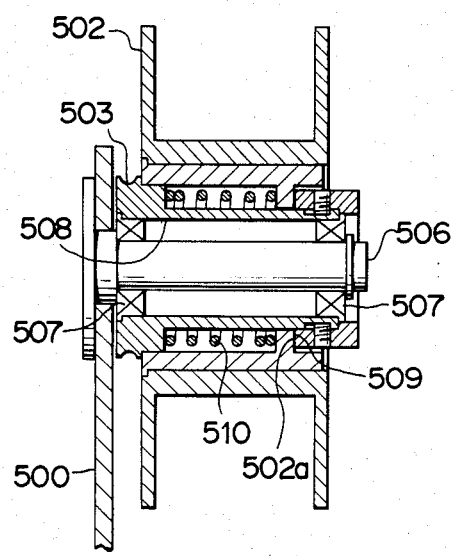
FIG. 42 is a sectional side elevation view showing a take-up reel.

The take-up reel 502 is supported on the support frame 500 through a support structure detailedly shown in FIG. 42. More particularly, the support structure includes a shaft 506 fixed on the support frame 500, on which a cylindrical member 508 formed integral with the pulley 503 is rotatably mounted through a bearing 507. The cylindrical member 508 is formed on an outer surface thereof with an annular recess which has a pair of vertical surfaces 509 opposite to each other. The take-up reel 502 is arranged on an outside of the cylindrical member 509 and formed on an inner surface thereof with projection 502a which is received in the recess of the cylindrical member 508. The projection 502a is forcedly abutted at one of side surfaces thereof against one of the vertical surfaces 508 by means of a compression spring 510 received in the recess of the cylindrical member. Such construction allows rotation of the pulley 503 to be transmitted to the reel 502 under substantially constant frictional force, so that the reel may effectively wind up the cover tape T3 thereon under substantially constant winding-up force.

Figure 43:
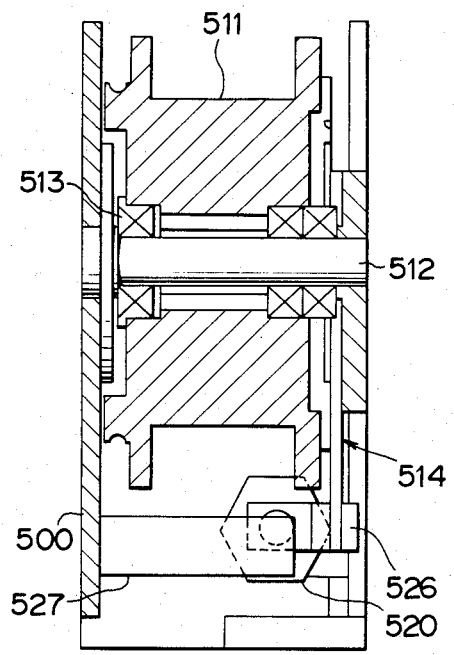
FIG. 43 is a sectional side elevation view showing a pitch feed wheel.

As shown in FIG. 40, on a left end of the support frame 500 is rotatably supported a pitch feed wheel 511. The pitch feed wheel 511, as shown in FIG. 43, is rotatably mounted through a bearing 513 on a shaft 512 fixedly mounted on the support frame 500 so that it may be intermittently rotated in a left direction in FIG. 40 through a ratchet mechanism 514 arranged on a side thereof. The pitch feed wheel 511 is adapted of intermittently travel the storage tape T2 at a constant pitch. For this purpose, the wheel 511 is provided with pin means or the like (not shown) which is engaged with the perforations T4.

Figure 44:
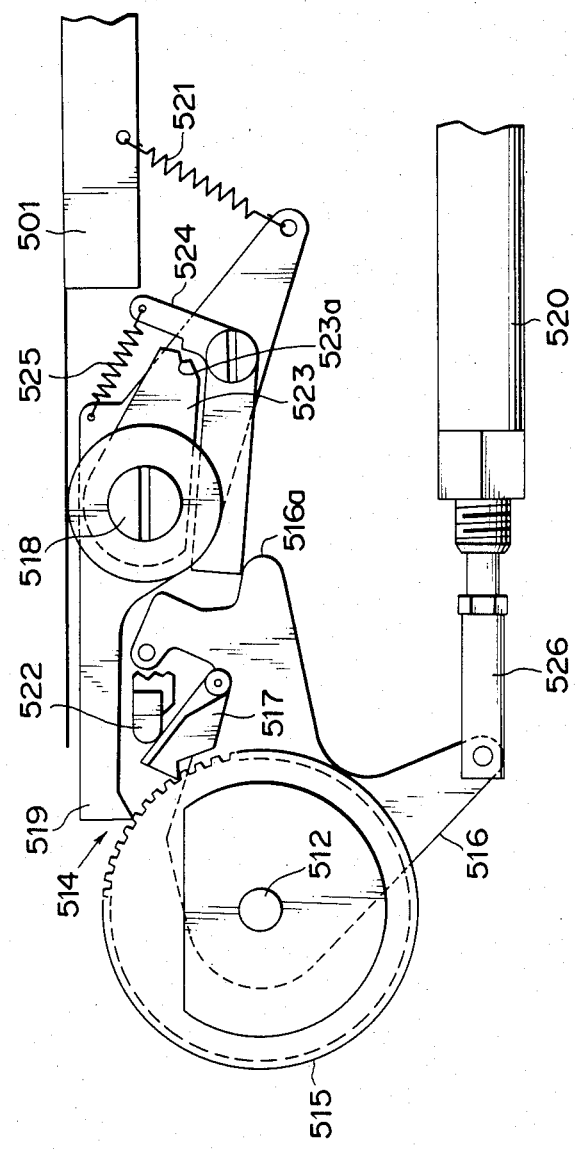
FIG. 44 is a front elevation view showing operation of a ratchet mechanism attached to the pitch feed wheel of FIG. 43.

The ratchet mechanism 514, as shown in FIGS. 40 and 44, includes a gear 515 formed integral with the pitch feed wheel 511, a feed lever 516 supported on the shaft 512, a feed pawl 517 pivotally mounted on the feed lever 516. A stopper lever 519 pivotally mounted on the support frame 500 through a shaft 518. and an air cylinder 520.

The feed pawl 517 is resiliently forced in a direction of being engaged with the gear 515 by means of a spring (not shown) and the stopper lever 519 likewise is forced so as to be engaged with the gear 515 by means of an extension spring 521. A range of movement of the feed pawl 517 is regulated by means of a feed pawl stopped 522 fixed on the support frame 500.

Construction that the stopper lever 519 is constantly engaged with the gear 515 exhibits a disadvantage that in the case that a distal pawl of the stopper lever 519 transfers from a crest of the gear 515 to a root thereof, the circuit element E received in the recess T1 of the storage tape T2 is unsteady due to impact occurring where the distal pawl drops in the foot at the same time when gear 515 is apt to rotate with a speed higher than the feed pawl. Also, when the stopper lever 519 is vertically moved many times at every pitch feed, the stopper lever 519 and gear 515 are highly worn away.

In order to avoid such disadvantages, a stationary cam 523 is mounted on the shaft 518 coaxially with the stopper lever 519 and a stopper control lever 524 is supported on the stopper lever so as to be engaged with a groove 523a of the stationary cam 523. The stopper control lever 524 is forced toward the stationary cam 523 by means of an extension spring 525.

Such construction ensures that when the feed pawl 517 rotates the gear 515 in a counterclockwise direction, the stopper lever 519 necessarily transfers from the root of the gear 515 to the crest thereof, so that a pawl of the stopper control lever 524, as shown in FIG. 40, may enter the groove 523a of the stationary cam 523 at a position where the distal end of the stopper lever 519 is raised, to thereby hold the stopper lever at the raised position. This effectively prevents irregular rotation of the gear 515 and wearing of the gear 515 and stopper lever 519.

Before the feed pawl 517 completes pitch feed, an end 516a of the feed lever 516 actuates the stopper control lever 524 to release engagement between the stopper control lever 524 and the stationary cam 523 as shown in FIG. 44, so that the pawl of the stopper lever 519 may enter the root of the gear 515 to prevent reverse rotation of the gear 515. Also, the feed pawl 517 stops by abutting against the feed pawl stopper 522, during which it is rigidly engaged with the gear 515 to prevent its overrun.

Figure 45:
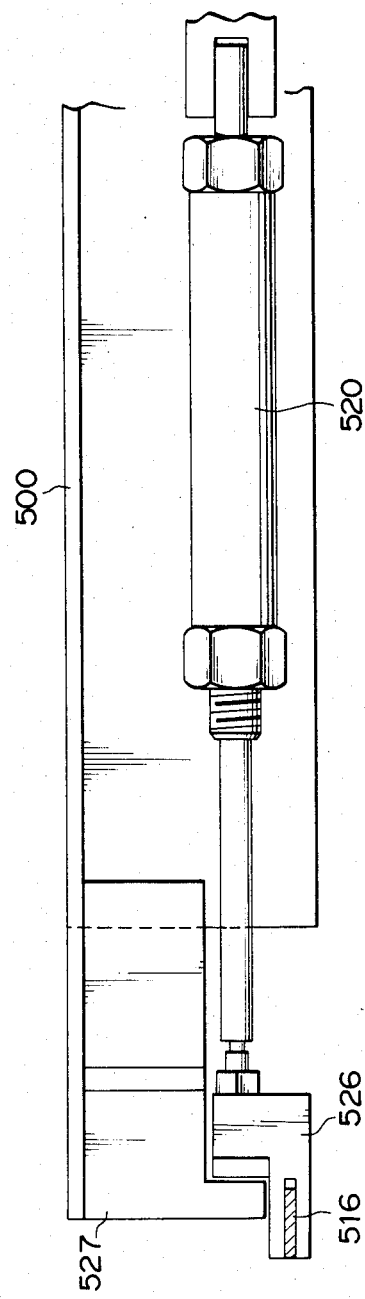
FIG. 45 is a plan view showing an air cylinder assembly for actuating the ratchet mechanism of FIG. 44.

The air cylinder 520, as shown in FIG. 45, is mounted at a body thereof on the support frame 500 and pivotally mounted at a distal end of a rod thereof on the feed lever 516 through a connection member 526. Also, a pitch variable stopper 527 is fixed on the support frame 500 so that it may abut against the connection member 526 to adjust a stroke of the air cylinder 520. Accordingly, the stroke of the air cylinder is defined by a distance between the most contracted position and a position where the connection member 526 is abutted against the pitch variable stopper 527 due to extension of the air cylinder 520. The pitch variable stopper 527 is provided for the purpose of accommodating the tape feeder to various kinds of circuit element trains different in intervals between circuit elements.

Rotation of the pitch feed wheel 522 in a fixed amount in a counterclockwise direction is carried out at every contraction of the air cylinder 520. More particularly, at the time of the contraction, the feed pawl 517 is moved from a position shown in FIG. 40 to a position shown in FIG. 44 to rotate the gear 515 in the counterclockwise direction; whereas, at the time of extension of the air cylinder, the stopper lever 519 locks the gear 515, so that only the feed pawl 517 is returned to its original position.

Figure 48:
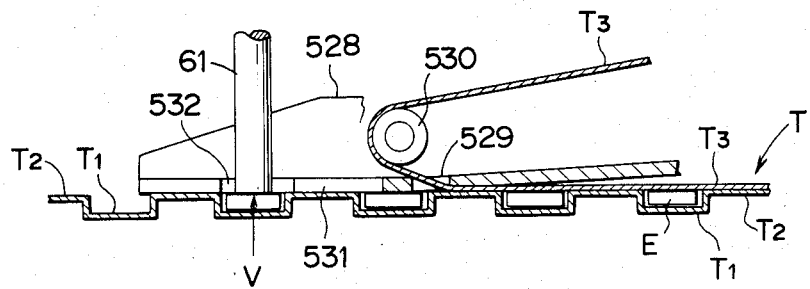
FIG. 48 is a sectional front elevation view showing an upper tape guide assembly.

Opposite to the travel guide 501 arranged in front of the pitch feed wheel 511 is fixed an upper tape guide 528 on the support frame 500. The upper tape guide 528, as shown in FIG. 48, is formed at an intermediate portion thereof with a slit 529 for drawing out the cover tape T3 therethrough. Rotatably mounted on the tape guide 528 above the slit 529 is a roller 530 for peeling off the cover tape from the storage tape T2 smoothly. Accordingly, the cover tape T3 of the circuit element train T is passed around the roller 530 under tension and then wound up on the take-up reel 502.

Figure 41:
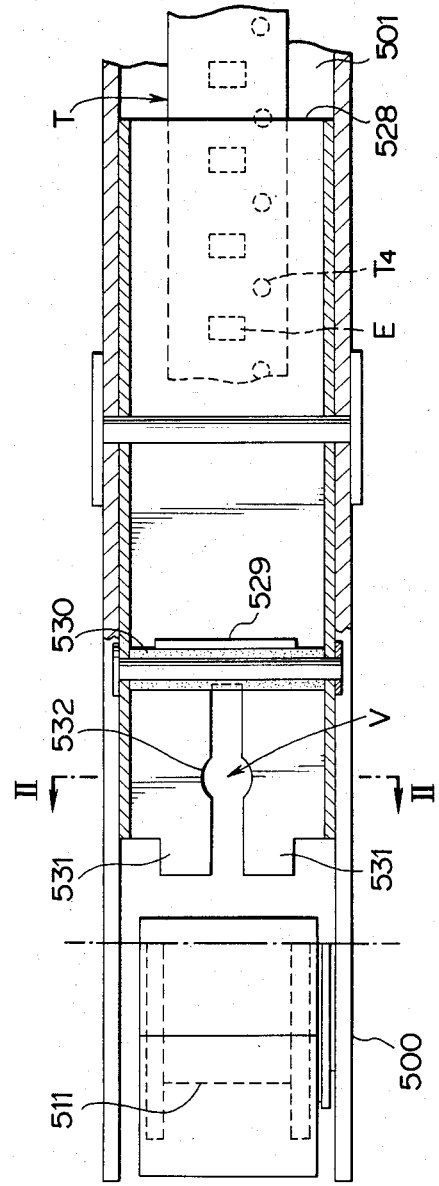
FIG. 41 is a sectional plan view showing an essential part of the tape feeder of FIG. 40.

As shown in FIGS. 41 and 48, the upper tape guide 528 is provided with a tape presser 531 which serves to prevent both edges of the storage tape T2 from which the cover tape T3 has been peeled off from being raised. The tape presser 531 may be provided to cover at least a part of the recess T1 in which the circuit element E is received.

The tape presser 531 of the upper tape guide 528 is formed with a large hole 532 at a position corresponding to the circuit element extracting position V defined on the travel guide 501, so that the sution pin 51 of the circuit element extracting head 60 may take out exposed one of the circuit elements E received in the recesses T1 therethrough by suction.

Figure 46:
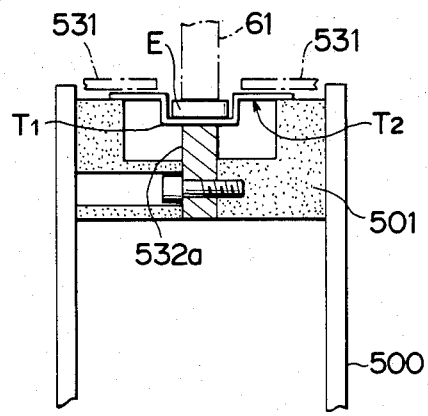
FIG. 46 is a sectional view taken along line II—II of FIG. 41 which shows a mechanism for supporting the train of circuit elements shown in FIGS. 38 and 39 at a circuit element extracting position.

When the suction pin 61 is lowered at the circuit element extracting position V in order to extract a circuit element E which has lead wires attached to its body such as a chip IC or the like, there is a fear that the lead wires of the circuit element E are deformed or bent due to bending of the storage tape T2 caused by lowering of the suction pin 61, because a bottom surface of the travel guide 501 does not coincide with a bottom surface of the recess T1 of the storage tape. In order to eliminate such a problem, the tape feeder includes a tape support member 532a which arranged to be projected upwardly through a portion of the bottom surface of the travel guide 501 corresponding to the circuit element extracting position V so that an upper surface of the tape support member 532a may be coincided with the bottom surface of the recess T1, as shown in FIG. 46. A height or length of the tape support member 532a is determined depending on a type of the circuit element E or a depth of the recess T1.

Figure 47:
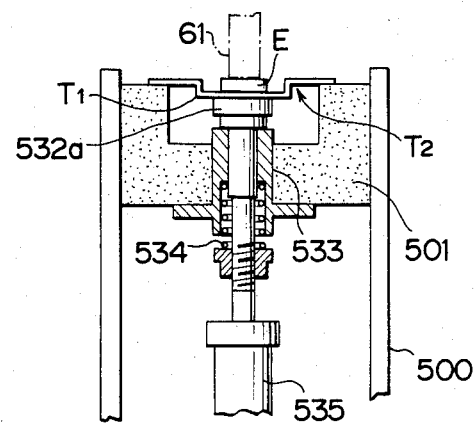
FIG. 47 is a sectional view showing a modification of the supporting mechanism shown in FIG. 46.

FIG. 47 shows a modification of arrangement of the tape support member 532a. In FIG. 47, a cylindrical member 533 is fixed to pass through the portion of the travel guide 501 corresponding to the circuit 31 element extracting position V, the tape support member 532a is vertically movably inserted through the cylindrical member 533, and the tape support member 532 is downwardly forced by a compression spring 534. The tape support member 532 is upwardly moved by means of an air cylinder 535 when the suction pin 61 is lowered, to thereby support the bottom surface of the recess T1 of the storage tape T2 thereon.

Now, the manner of operation of the tape feeder constructed as desired above will be described hereinafter.

The circuit element train T drawn out from the supply reel is guided to the travel guide 501, and the cover tape T3 is peeled off from the storage tape T2 by the roller 530 and then wound up on the take-up reel 502.

The storage tape T2 from which the cover tape T3 has been peeled off is intermittently transferred in the left direction in FIG. 40 by the pitch feed wheel 511 rotated in a predetermined amount in the counterclockwise direction corresponding to contraction of the air cylinder 520. This results in the circuit elements received in the recesses T1 of the storage tape T2 being carried to the circuit element extracting position V in turn, during which the tape presser 531 of the upper tape guide 528 regulates both edges of the tape and/or covers a part of the recess T1 to prevent the circuit elements E from flying away from the recesses due to looseness, torsion or vibration of the storage tape T2.

Then, the circuit element E in the recess T1 is exposed at the circuit element extracting position V and taken out by the suction pin 61.

As described above, the tape feeder is so constructed that the pitch feed wheel intermittently transfers the storage tape supporting the circuit element thereon under tension and the roller is arranged in front of the pitch feed wheel to peel off the cover tape from the storage tape. Such construction effectively prevents looseness, torsion and deformation of the storage tape. Also, peeling-off of the cover tape from the storage tape is smoothly and positively accomplished due to use of the roller. Further, the tape feeder is provided with the tape presser for holding at least the upper surface of the storage tape from which the cover tape has been peeled off, so that the circuit elements may be prevented from flying away from the recesses.

When an emptied portion of the storage tape T2 from which the circuit elements are removed by the suction pin 61 is left as its is, it often hinders not only pitch feed operation but operation of other mechanisms.

Figure 49:
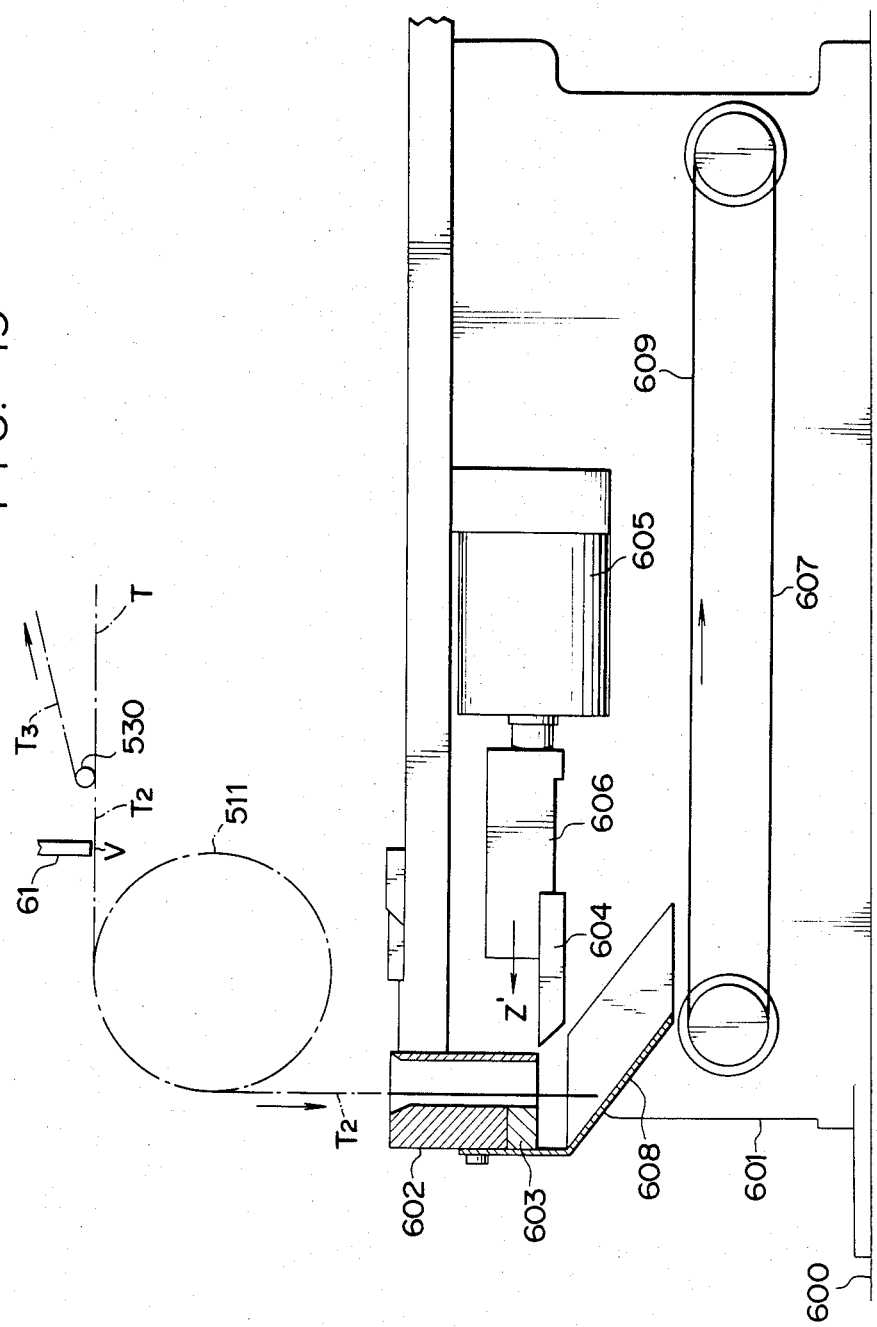
FIG. 49 is a front elevation view partly in section showing a tape cutting mechanism or unit.
Figure 50:
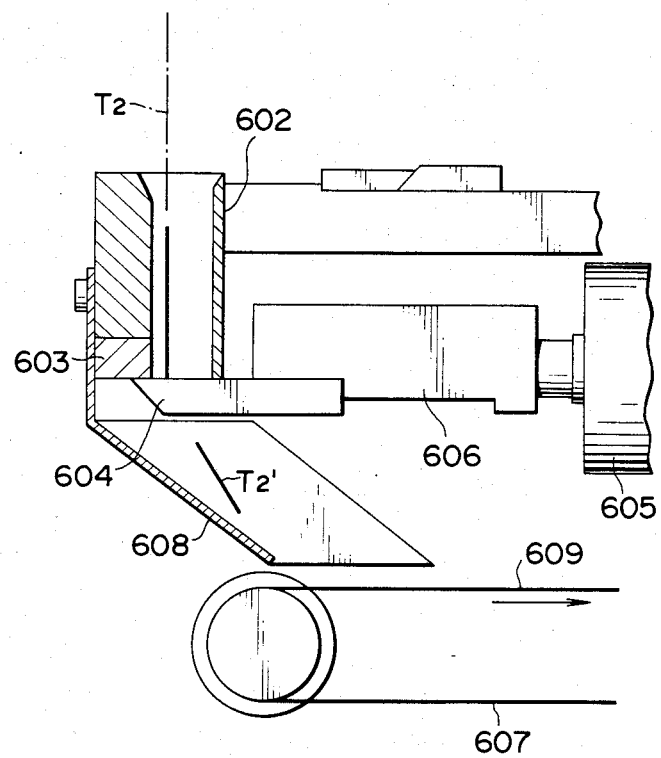
FIG. 50 is a sectional front elevation view showing an essential part of the tape cutting unit of FIG. 49.

In order to eliminate such a disadvantage, the automatic circuit element mounting apparatus of the illustrated embodiment may include a tape cutting unit or mechanism as shown in FIGS. 49 and 50 which is adapted to cut the emptied portion of the storage tape into small pieces for disposal.

The tape cutting unit or mechanism shown in FIGS. 49 and 50 includes a base 600 and a support frame 601 fixedly mounted on the base 600. The above-described pitch feed wheel 511 is arranged above the support frame 601.

The circuit element extracting position V at which the circuit elements E are taken out from the circuit element train T is defined in front of the pitch feed wheel 511 and the roller peels off the cover tape T3 from the storage tape T2 in front of the position V to expose the circuit elements, as described above. The exposed circuit elements are taken out by the suction pin 61 in turn.

On a left end of the support frame 601 is arranged a duct-like tape guide 602 for downwardly guiding therethrough the empty tape T2 delivered by the pitch feed wheel 511. At a lower end of the tape guide 602 is fixed a stationary blade 603 of a cutter. A movable blade 604 is fixed on a movable member 606 mounted on a rod of an air cylinder 605.

The tape cutting unit also includes a chute 608 arranged in proximity to a lower end of an opening of the tape guide 602, which serves to drop small pieces formed by cutting the empty tape T2 therethrough onto a belt conveyor 607. The belt conveyor 607 includes a belt 609 horizontally travelled in a direction indicated at an arrow in FIGS. 49 and 50.

The empty storage tape T2 is downwardly carried through the tape guide 602 and hangs down by a predetermined length from the lower end of the opening of the tape guide 602 due to intermittent rotation of the pitch feed wheel 511. Then, the air cylinder 605 is actuated to forward move the movable blade 604 through the movable member 606 as indicated at an arrow Z' (FIG. 49) to cut the empty storage tape T2 into small pieces T2' as shown in FIG. 50. Each of the so-formed small pieces T2' drops through the chute 608 onto the belt 609 of the belt conveyor 607 by its own weight, which then carries the small pieces to a dust bin (not shown) arranged in proximity to the belt 609 for disposal.

Thus, it will be noted that the tape cutting unit constructed as described above is capable of disposing of the empty tape, to thereby prevent it from hindering operation of the automatic circuit element mounting apparatus.

While a preferred embodiment of the invention has been described with a certain degree of particularity with reference to the drawings, obvious modifications and variations are possible in the light of the above teachings. It is therefore to be understood that within the scope of the appended claims, the invention may be practiced otherwise than as specifically described.

What is claimed is:

1. An apparatus for mounting a circuit element on a printed circuit board comprising:
    a base;
    a circuit element supply mechanism for supplying a circuit element to a predetermined position on said base;
    a centering and optional turning mechanism for regulating a position and a posture of said circuit element;
    a circuit element extracting head arranged so as to be movable between said supply mechanism and said centering and optional turning mechanism, said extracting head taking out said circuit element from said supply mechanism by suction and delivering said taken-out circuit element to said centering and optional turning mechanism;
    a mounting head arranged so as to be movable with respect a printed circuit board, said mounting head holding said circuit element of which the position and posture have been regulated by said centering and optional turning mechanism thereon by suction and carrying it to said printed circuit board;
    a substrate support mechanism for supporting thereon said printed circuit board on which said circuit element is to be mounted;
    a lead wire detection mechanism for detecting lead wires of said circuit element of which the position and posture have been regulated by said centering and optional turning mechanism; and
    a substrate mark detection mechanism for detecting a mounting reference mark on said printed circuit board supported on said substrate support mechanism;
    all of said mechanisms being mounted on said base;
    whereby movement of said mounting head with respect to said printed circuit board is corrected depending on a result of detection by each of said detection mechanisms.

2. An apparatus as defined in claim 1, wherein said circuit element supply mechanism includes a tray feeder and a stick feeder.

3. An apparatus as defined in claim 2, wherein said tray feeder includes a support arranged so as to be movable in a longitudinal direction, an elevator arranged so as to be vertically movable with respect to said support and supporting thereon a plurality of stacked trays, a positioning means having a marking coinciding with an interval between circuit elements arranged on said tray, a sensor for detecting said marking, a driving means for forward moving said support by a distance corresponding to said interval depending on detection of said marking by said sensor, a tray taking-out head for taking out an empty tray from which said circuit elements have been removed, and a tray receiver for receiving said empty tray discharged by said tray taking-out head.

4. An apparatus as defined in claim 3, wherein said positioning means comprises an elongated plate formed with recesses, projections or holes which serve as said marking.

5. An apparatus as defined in claim 2, wherein said stick feeder includes a frame for supporting at least one magazine having circuit elements received therein, a chute for providing a circuit element passage communicated with said magazine, and a belt conveyor for receiving the circuit elements through said chute from said magazine thereon and transferring them to a circuit element extracting position one by one, said chute being provided with a means for holding thereon a circuit element in said chute.

6. An apparatus as defined in claim 5, wherein said magazine and chute are arranged in a manner to be inclined to a horizontal plane so that said chute is downwardly directed.

7. An apparatus as defined in claim 1, wherein said circuit element supply mechanism includes a tray feeder and a tape feeder.

8. An apparatus as defined in claim 7, wherein said tape feeder includes a pitch feed wheel for intermittently traveling, at a predetermined pitch, a storage tape formed with recesses for receiving circuit elements therein at equal intervals; a roller arranged in front of said pitch feed wheel to peel off from said storage tape a cover tape for covering said recesses of said storage tape, and a tape presser for regulating at least an upper surface of said storage tape from which said cover tape has been peeled off, so that each of said circuit elements may be exposed to be extractable from said storage tape at a circuit element extracting position defined in front of said pitch feed wheel.

9. An apparatus as defined in claim 8, wherein said tape presser has an opening formed at a middle portion thereof and said circuit element extracting position is defined in an interior of said opening of said tape presser.

10. An apparatus as defined in claim 8, wherein said tape presser regulates at least both edges of said upper surface of said storage tape.

11. An apparatus as defined in claim 7, wherein said tape feeder includes a pitch feed wheel for intermittently travelling a storage tape formed with recesses at equal intervals in which circuit elements are received at a predetermined pitch so that a cover tape for covering said recesses of said storage tape may be peeled off from said storage tape in front of said pitch feed wheel to cause said circuit elements to be taken out at a circuit element extracting position defined in front of said pitch feed wheel, and a ratchet mechanism;

said ratchet mechanism comprising a ratchet gear arranged so as to rotatable together with said pitch feed wheel, a feed lever arranged to be pivotally movable and coaxial with said ratchet gear, a feed pawl pivotally mounted on said feed lever and forced in a direction of being engaged with said gear, a feed pawl stopper abutted against said feed pawl to stop it, a backstop stopper lever forced in a direction of being engaged with said gear, a stopper control lever pivotally mounted on said stopper lever, and a stationary cam engageable with said stopper control lever, so that pivotal movement of said feed lever may rotate said ratchet gear through said feed pawl in a predetermined amount in a forward direction and causes said stopper control lever to be engaged with said stationary cam to release said backstop stopper lever from said ratchet gear when said ratchet is rotated in the forward direction.

12. An apparatus as defined in claim 7, wherein said tape feeder includes a tape cutting unit including a cutter for cutting an empty tape from which circuit elements have been removed into small pieces and a belt conveyor for discharging said small pieces.

13. An apparatus as defined in claim 7, wherein said tray feeder includes a support arranged so as to be movable in a longitudinal direction, an elevator arranged so as to be vertically movable with respect to said support and supporting thereon a plurality of stacked trays, a positioning means having a marking coinciding with an interval between circuit elements arranged on said tray, a sensor for detecting said marking, a driving means for forward moving said support by a distance corresponding to said interval depending on detection of said marking by said sensor, a tray taking-out head for taking out an empty tray from which said circuit elements have been removed, and a tray receiver for receiving said empty tray discharged by said tray taking-out head.

14. An apparatus as defined in claim 13, wherein said positioning means comprises an elongated plate formed with recesses, projections or holes which serve as said marking.

15. An apparatus as defined in claim 7, wherein said stick feeder includes a frame for supporting at least one magazine having circuit elements received therein, a chute for providing a circuit element passage communicated with said magazine, and a belt conveyor for receiving circuit elements through said chute from said magazine thereon and transferring them to a circuit element extracting position one by one, said chute being provided with a means for holding thereon a circuit element in said chute.

16. An apparatus as defined in claim 15, wherein said magazine and chute are arranged in a manner to be inclined to a horizontal plane so that said chute is downwardly directed.

17. In a method for mounting a circuit element on a printed circuit board, including the steps of supplying a circuit element to a predetermined position of an automatic mounting apparatus; transferring said circuit element from said predetermined position to a centering and optional turning mechanism incorporated in said mounting apparatus to carry out the centering and turning of the circuit element by four claws, said four claws being mounted on said centering and optional turning mechanism and being arranged so as to be opposite to four sides of a circuit element; delivering said circuit element to a mounting head which is adapted to hold a circuit element thereon by suction; conveying a printed circuit board to a stop position; and mounting the circuit element on said printed circuit board when is at said stop position, the improvement resides in that:

said step of centering and optional turning of said circuit element by said four claws comprises holding two sides of said circuit element parallel to each other between one pair of claws of said four claws positioned oppositely to said two parallel sides of said circuit element through a tip end of each of lead wires projecting from said two parallel sides or a body of said circuit element and then separating said two claws from said lead wires of said body, and thereafter holding the remaining two sides of said circuit element between the other pair of claws through a tip end of each of lead wires projecting from said remaining two sides or said body.

18. A method as defined in claim 17, further including the steps of irradiating light to a circuit element held on said mounting head to display a binary optical image of each of lead wires projecting from said circuit element on a telescreen of a TV; and finding an axial center of said lead wire based on said optical image and a pitch interval between each adjacent two optical image about said center to detect bending of each of said lead wires by operation of comparison between each of said pitch intervals and an average thereof, to thereby mount only indefective circuit elements on a printed circuit board.

19. A method as defined in claim 17, further including the steps of:
preparing a printed circuit board having at least one mounting reference mark formed of the same material as a conducting pattern deposited thereon to convey it to said stop position;
radially irradiating light to a whole surface of said mounting reference to randomly display an optical image on a telescreen of a TV through a camera by means of light reflected on said mounting reference mark, said telescreen of said TV having an outer frame line and a center of a reference pattern corresponding to said mounting reference mark on a central position thereof;
coinciding said random optical image of said mounting reference mark displayed on said telescreen of said TV with said outer frame line of said reference pattern by up-down adjustment of a binary level;

comparing a center of said optical image coincided with said reference pattern with said center of said reference pattern preset on said telescreen of said TV;

and detecting misregistration between said center of said optical image and said center of said reference pattern to adjust a positional correlation between said mounting head for mounting said circuit element on said substrate and said substrate, to thereby precisely mount said circuit element on a predetermined portion of said printed circuit board.

20. A method for mounting a circuit element on a printed circuit board, comprising the steps of:

supplying a circuit element to a predetermined position of an automatic mounting apparatus;

transferring said circuit element from said predetermined position to a centering and optional turning mechanism incorporated in said mounting apparatus to carry out the centering and turning of the circuit element by four claws which are mounted on said centering and optional turning mechanism and arranged so as to be opposite to four sides of a circuit element, said step of centering and optional turning of said circuit element by asid four claws comprising the steps of holding two sides of said circuit element parallel to each other between one pair of claws of said four claws positioned oppositely to said two parallel sides of said circuit element through a tip end of each of lead wires projecting from said two parallel sides or a body of said circuit element and then separating said two claws from said lead wires or said body, and thereafter holding the remaining two sides of said circuit element between the other pair of claws through a tip end of each of lead wires projecting from said remaining two sides or said body;

delivering said circuit element to a mounting head which is adapted to hold a circuit element thereon by suction;

irradiating light to said circuit element held on said mounting head to display a binary optical image of each of said lead wires of said circuit element on a telescreen of a TV; finding an axial center of said lead wire based on said optical image and a pitch ineterval between each adjacent two optical image about said center to detect bending of each of said lead wires by operation of comparison between each of said pitch intervals and an average thereof; and discharging lead wire bended circuit elements from a circuit element mounting line;

preparing a printed circuit board having at least one mounting reference mark formed of the same material as a conducting pattern deposited thereon to convey it to a stop poition; and radially irradiating light to a whole surface of said mounting reference to randomly display an optical image on a telescreen of a TV through a camera by means of light reflected on said mounting reference mark, said telescreen of said TV having an outer frame line and a center of a reference pattern corresponding to said mounting reference mark on a central position thereof; coiciding said random optical image of said mounting reference mark displayed on said telescreen of said TV with said outer frame line of said reference pattern by up-down adjustment of a binary level; comparing a center of said optical image coincided with said reference pattern with said center of said reference pattern preset on said telescreen of said TV; and detecting misregistration between said center of said optical image and said center of said reference pattern to adjust a positional correlation between said mounting head holding an indefective circuit element thereon and said substrate, to thereby precisely mount said indefective circuit element on a predetermined portion of said printed circuit board.

* * * * *